(12) United States Patent
Takaishi

(10) Patent No.: US 9,136,227 B2
(45) Date of Patent: Sep. 15, 2015

(54) SEMICONDUCTOR DEVICE WITH BURIED BIT LINE

(75) Inventor: Yoshihiro Takaishi, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 307 days.

(21) Appl. No.: 13/040,871

(22) Filed: Mar. 4, 2011

(65) Prior Publication Data

US 2011/0215391 A1 Sep. 8, 2011

(30) Foreign Application Priority Data

Mar. 8, 2010 (JP) ................................. 2010-050855

(51) Int. Cl.
| | | |
|---|---|---|
| *H01L 27/108* | (2006.01) | |
| *H01L 29/76* | (2006.01) | |
| *H01L 29/792* | (2006.01) | |
| *H01L 23/58* | (2006.01) | |
| *H01L 29/78* | (2006.01) | |

(52) U.S. Cl.
CPC .............. *H01L 23/58* (2013.01); *H01L 27/108* (2013.01); *H01L 29/78* (2013.01); *H01L 2924/0002* (2013.01)

(58) Field of Classification Search
CPC ................... H01L 27/10876; H01L 29/66666; H01L 29/7827; H01L 27/10885; H01L 27/10823; H01L 29/78642; H01L 27/108; H01L 27/10814; H01L 27/10852; H01L 29/4236; H01L 29/7926
USPC ..................... 257/296, 324, 329, 315, E29.26
See application file for complete search history.

(56) References Cited

U.S. PATENT DOCUMENTS

| | | | | |
|---|---|---|---|---|
| 5,874,760 | A * | 2/1999 | Burns et al. .................... | 257/315 |
| 5,990,509 | A * | 11/1999 | Burns et al. .................... | 257/296 |
| 6,504,201 | B1 * | 1/2003 | Noble et al. .................. | 257/302 |
| 6,596,608 | B2 * | 7/2003 | Saito ............................. | 438/424 |
| 7,531,412 | B2 * | 5/2009 | Yoon et al. .................... | 438/270 |
| 7,586,149 | B2 * | 9/2009 | Yoon et al. .................... | 257/329 |
| 7,643,345 | B2 * | 1/2010 | Ishibashi .................. | 365/185.13 |
| 8,008,698 | B2 * | 8/2011 | Lee et al. ....................... | 257/296 |
| 2007/0190766 | A1* | 8/2007 | Seo et al. ....................... | 438/585 |

FOREIGN PATENT DOCUMENTS

| | | |
|---|---|---|
| JP | 2007-048941 A | 2/2007 |
| JP | 2009-164597 A | 7/2009 |

* cited by examiner

*Primary Examiner* — Shouxiang Hu

(57) ABSTRACT

A semiconductor device includes an isolation region, a semiconductor region, a groove, and an insulating film. The semiconductor region is defined by the isolation region. The groove is in the semiconductor region. The groove has first and second ends. At least one of the first and second ends reaches the isolation region. The insulating film is in the groove.

16 Claims, 27 Drawing Sheets

Y-Y'

X-X'

Y-Y'

X-X'

Y-Y'

X-X'

Y-Y'

X-X'

Y-Y'

X-X'

Y-Y'

X-X'

Y-Y'

X-X'

Y-Y'

X-X'

Y1-Y1'

Y2-Y2'

X1-X1'

X2-X2'

Y1-Y1'

Y2-Y2'

X1-X1'

X2-X2'

Y1-Y1'

Y2-Y2'

X1-X1'

X2-X2'

Y1-Y1'

Y2-Y2'

X1-X1'

X2-X2'

Y2-Y2'

Y2-Y2'

X2-X2'

SEMICONDUCTOR DEVICE WITH BURIED BIT LINE

BACKGROUND OF THE INVENTION

1. Field of the Invention

The present invention relates to a semiconductor device and a method of manufacturing the semiconductor device.

Priority is claimed on Japanese Patent Application No. 2010-050855, Mar. 8, 2010, the content of which is incorporated herein by reference.

2. Description of the Related Art

Improvement in the degree of integration of semiconductor devices has been achieved by miniaturization of transistors. However, the miniaturization of the transistors has almost reached its limit. Further miniaturization beyond its limit can cause short channel effects of transistors which make it difficult for the transistor to operate accurately.

Japanese Unexamined Patent Application, First Publication, No. JP-A-2009-164597 and Japanese Unexamined Patent Application, Second Publication, No. JP-A-2007-48941 disclose that, to solve this problem fundamentally, a method of three-dimensionally forming the transistor by processing a semiconductor substrate in a three-dimensional manner. For example, a vertical transistor has been suggested. The vertical transistor employs, as a channel, a silicon pillar that extends in a direction vertical to a main surface of the semiconductor substrate. The vertical transistor may have advantages such as obtaining a larger drain current due to a small occupied area and complete depletion. The vertical transistor may realize a close-packed layout known as 4F2 (F being the minimum processing size).

In general, a dynamic random access memory (DRAM) includes a plurality of memory cells each of which includes the vertical transistor including the silicon pillar and a capacitor. The vertical transistor has the following configurations. One of impurity diffusion layers such as a source or drain of the vertical transistor is connected to a bit line. The other thereof is connected to the capacitor.

Typically, the capacitor is disposed over the vertical transistor among the capacitor and the vertical transistor which constitute the memory cell. The capacitor is disposed over the silicon pillar. The bit line is disposed below the silicon pillar. Due to this, it is necessary for the bit line to be buried in the semiconductor substrate including the silicon pillars, and the bit line to extend under the alignment of the silicon pillars.

SUMMARY

In one embodiment, a semiconductor device may include, but is not limited to, an isolation region, a semiconductor region, a groove, and an insulating film. The semiconductor region is defined by the isolation region. The groove is in the semiconductor region. The groove has first and second ends. At least one of the first and second ends reaches the isolation region. The insulating film is in the groove.

In another embodiment, a semiconductor device may include, but is not limited to, an isolation region, a semiconductor region, first and second grooves, and insulating films. The semiconductor region is defined by the isolation region. The first and second grooves are in the semiconductor region. The first and second grooves extend in parallel to each other. Each of the first and second grooves has first and second ends. The first and second ends reach the isolation region. The insulating films are in the first and second grooves.

In still another embodiment, a semiconductor device may include, but is not limited to, a semiconductor substrate, an insulating film, first and second grooves, insulators, and a buried bit line. The insulating film is in a surface region of the semiconductor substrate. The insulating film defines a semiconductor region of the semiconductor substrate. The first and second grooves are in the semiconductor region. The first and second grooves extend in a first direction. The first and second grooves are disposed adjacent to each other. The ends of each of the first and second grooves reach the insulating film. The insulators are in the first and second grooves. The buried bit line is in the semiconductor region. The buried bit line extends in the first direction. The buried bit line is in contact with the insulators.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail, in order to facilitate the understanding of the present invention.

Figure 16:
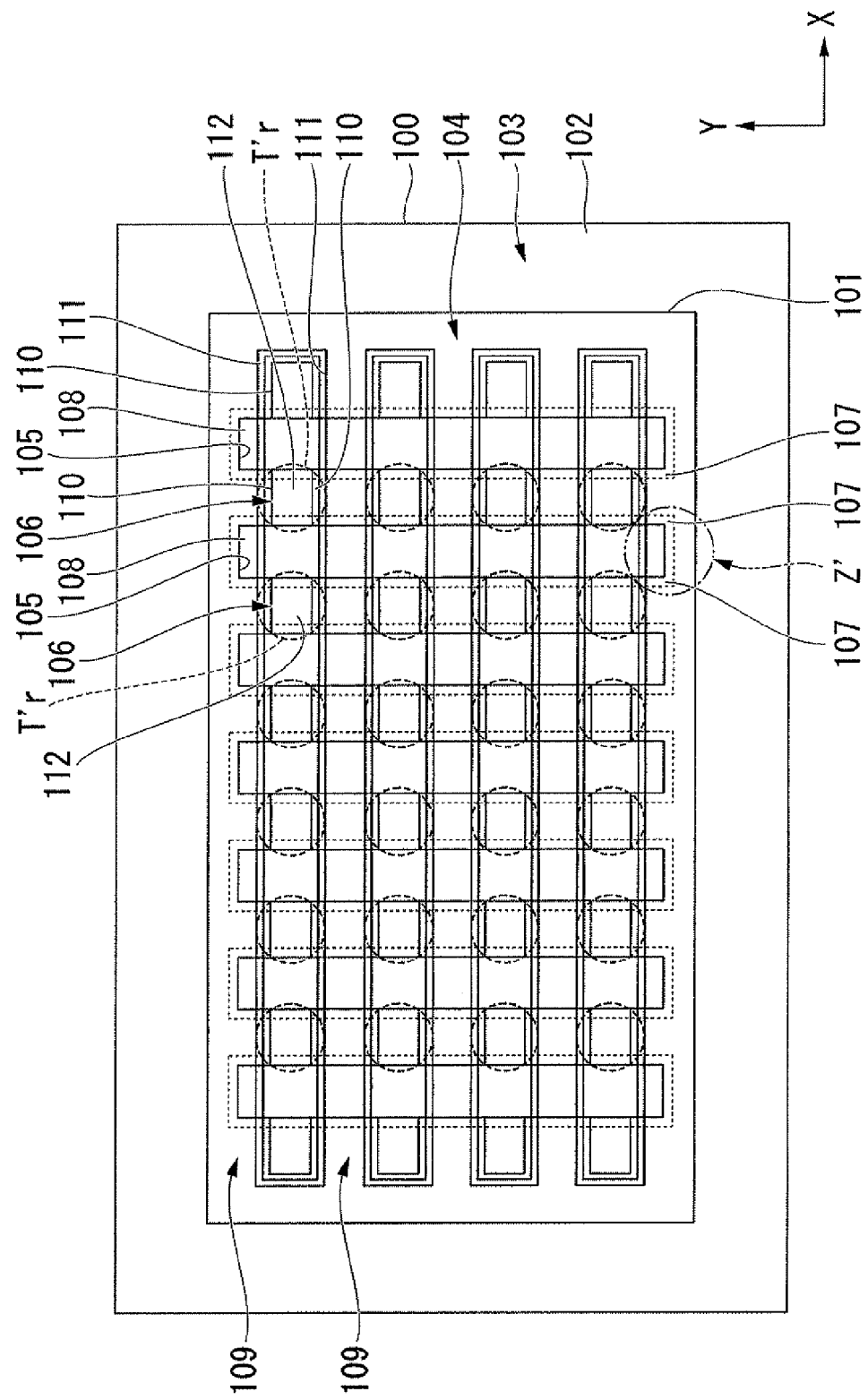
FIG. 16 is a fragmentary plan view illustrating a structure including a semiconductor device in accordance with the related art.

FIG. 16 shows a planar layout of a semiconductor device including vertical transistors of the related art.

As shown in FIG. 16, the semiconductor device includes a semiconductor substrate 100 which has a lower portion 101, a device isolation region 103, and a rectangular device formation region 104. The lower portion 101 is formed on a surface of the semiconductor substrate 100. The lower portion 101 is in the shape of a rectangular frame in plan view. The lower portion 101 is provided for device isolation. The device isolation region 103 is formed by burying an insulating layer 102 in the lower portion 101 for device isolation. The rectangular device formation region 104 is defined by the device isolation region 103. The rectangular device formation region 104 is surrounded by the device isolation region 103 in plan view.

Within the device formation region 104, a plurality of grooves 105 for bit line formation that extend in a first direction Y are arranged side by side. A plurality of pillars 106 are formed to protrude from the surface of the rectangular device formation region 104. Each pillar 106 is disposed between the grooves 105 for bit line formation. A buried bit line 107 formed of an impurity diffusion layer by diffusing impurities is formed in both side surfaces of each of the pillars 106. Further, an insulating layer 108 is buried in the groove 105.

Within the device formation region 104, a plurality of grooves 109 for gate electrode formation that extend in a second direction X crossing (orthogonal to) the first direction are formed side by side. The plurality of grooves 105 and the plurality of grooves 109 form a lattice. The plurality of pillars 106 are defined by the plurality of grooves 105 and the plurality of grooves 109. Due to this, the plurality of pillars 106 protrude from regions partitioned by the grooves 105 and 109, and the protruding portions may constitute vertical transistors Tr'. The plurality of pillars 106 are in a columnar shape.

In both side surfaces of the groove 109 for gate electrode formation, a gate insulating film 110 is formed. In the both side surfaces of the groove 109 for gate electrode formation, a gate electrode 111 (word line) is formed. The gate insulating film 110 is interposed between the gate electrode 111 and the side surface of the groove 109. That is, the vertical transistor Tr' has a double gate structure in which paired gate electrodes 111 are opposed to each other with respect to the pillar 106. Further, the impurity diffusion layer 112 is formed on an upper surface of each of the pillar 106 by diffusing impurities.

When a plurality of buried bit lines 107 are formed side by side within the device formation region 104, adjacent bit lines 107 are shorted in an end (indicated by an enclosed portion Z' of FIG. 16) of each of the grooves 105. The periphery of the device formation region 104 is surrounded by the device isolation region 103. The bit lines 107 are buried in the grooves 15.

The planar layout of the semiconductor device causes the follows. When impurities are diffused in the both side surfaces of the groove 105 in order to form the buried bit lines 107, the buried bit lines 107 formed in the both side surfaces of the pillars 106 are connected to each other at the ends of the groove 105. This is because the impurities are diffused even in the ends of the groove 105.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, an isolation region, a semiconductor region, a groove, and an insulating film. The semiconductor region is defined by the isolation region. The groove is in the semiconductor region. The groove has first and second ends. At least one of the first and second ends reaches the isolation region. The insulating film is in the groove.

In some cases, the semiconductor device may include, but is not limited to, the groove extending in a first direction.

In some cases, the semiconductor device may include, but is not limited to, the groove crossing a boundary of the isolation region and the semiconductor region.

In some cases, the semiconductor device may further include, but is not limited to, first and second buried bit lines. The groove is disposed between the first and second buried bit lines. The ends of each of the first and second buried bit lines reach the isolation region.

In some cases, the semiconductor device may further include, but is not limited to, a plurality of pillars in the semiconductor region. The plurality of pillars is aligned along the groove.

In some cases, the semiconductor device may further include, but is not limited to, a buried bit line extending along the groove. The buried bit line extends under bottom portions of the plurality of pillars.

In some cases, the semiconductor device may include, but is not limited to, the buried bit line including an impurity-introduced semiconductor.

In some cases, the semiconductor device may further include, but is not limited to, a transistor in each of the plurality of pillars. A part of the buried bit line functions as one of source and drain of the transistor.

In another embodiment, a semiconductor device may include, but is not limited to, an isolation region, a semiconductor region, first and second grooves, and insulating films. The semiconductor region is defined by the isolation region. The first and second grooves are in the semiconductor region. The first and second grooves extend in parallel to each other. Each of the first and second grooves has first and second ends. The first and second ends reach the isolation region. The insulating films are in the first and second grooves.

In some cases, the semiconductor device may include, but is not limited to, the first and second grooves crossing a boundary of the isolation region and the semiconductor region.

In some cases, the semiconductor device may further include, but is not limited to, first and second buried bit lines. One of the first and second grooves is disposed between the first and second buried bit lines. The ends of each of the first and second buried bit lines reach the isolation region.

In some cases, the semiconductor device may further include, but is not limited to, a plurality of pillars in the semiconductor region, the plurality of pillars being aligned along one of the first and second grooves.

In some cases, the semiconductor device may further include, but is not limited to, a buried bit line extending along the groove. The buried bit line extends under bottom portions of the plurality of pillars.

In some cases, the semiconductor device may further include, but is not limited to, a transistor in each of the plurality of pillars. A part of the buried bit line functions as one of source and drain of the transistor.

In still another embodiment, a semiconductor device may include, but is not limited to, a semiconductor substrate, an insulating film, first and second grooves, insulators, and a buried bit line. The insulating film is in a surface region of the semiconductor substrate. The insulating film defines a semiconductor region of the semiconductor substrate. The first and second grooves are in the semiconductor region. The first and second grooves extend in a first direction. The first and second grooves are disposed adjacent to each other. The ends of each of the first and second grooves reach the insulating film. The insulators are in the first and second grooves. The buried bit line is in the semiconductor region. The buried bit line extends in the first direction. The buried bit line is in contact with the insulators.

In some cases, the semiconductor device may include, but is not limited to, bottom surfaces of the first and second of grooves being higher in level than a top surface of the surface region.

In some cases, the semiconductor device may include, but is not limited to, the ends of each of the buried bit line reaching the insulating film.

In some cases, the semiconductor device may include, but is not limited to, the first and second grooves crossing a boundary of the insulating film and the semiconductor region.

In some cases, the semiconductor device may further include, but is not limited to, a plurality of pillars and a transistor. The plurality of pillars are in the semiconductor region. The plurality of pillars are aligned along one of the first and second grooves. The transistor is in each of the plurality of pillars. A part of the buried bit line functions as one of source and drain of the transistor.

In some cases, the semiconductor device may further include, but is not limited to, a capacitor electrically coupled to the transistor. The capacitor is disposed over the transistor.

In still another embodiment, a method for forming a semiconductor device may include, but is not limited to, the following processes. A semiconductor substrate is prepared to form a first portion and a second portion. The first portion surrounds the second portion. The first portion is lower in level than the second portion. A first insulating film is formed over the first portion. First and second grooves are formed in the second region. The first and second grooves are adjacent to each other. Ends of each of the first and second grooves reach the first insulating film. An impurity is introduced from bottom surfaces of the first and second grooves.

In some cases, the method may further include, but is not limited to, forming side walls on side surfaces of the first and second grooves before introducing the impurity.

In some cases, the method may further include, but is not limited to, heating the semiconductor substrate after introducing the impurity to form an impurity diffusion region.

In some cases, the method may further include, but is not limited to, digging the first and second grooves to divide the impurity diffusion region.

In some cases, the method may further include, but is not limited to, filling a second insulating film into the first and second grooves.

Hereinafter, a semiconductor device and a method of manufacturing the semiconductor device according to an embodiment of the invention will be described in detail with reference to the drawings. In the embodiment, a dynamic random access memory (DRAM) will be described. In the drawings used for the following description, to easily understand characteristics, there is a case where characteristic parts are enlarged and shown for convenience' sake, and ratios of constituent elements may not be the same as in reality. Materials, sizes, and the like exemplified in the following description are just examples and may be different from those of an actual structure, electrode structure, and semiconductor device. The invention is not limited thereto and may be appropriately modified within a scope which does not deviate from the concept of the invention.

Semiconductor Device

First, the structure of a semiconductor device 1 according to an embodiment of the present invention will be described with reference to FIGS. 1A to 1C.

Figure 1A:
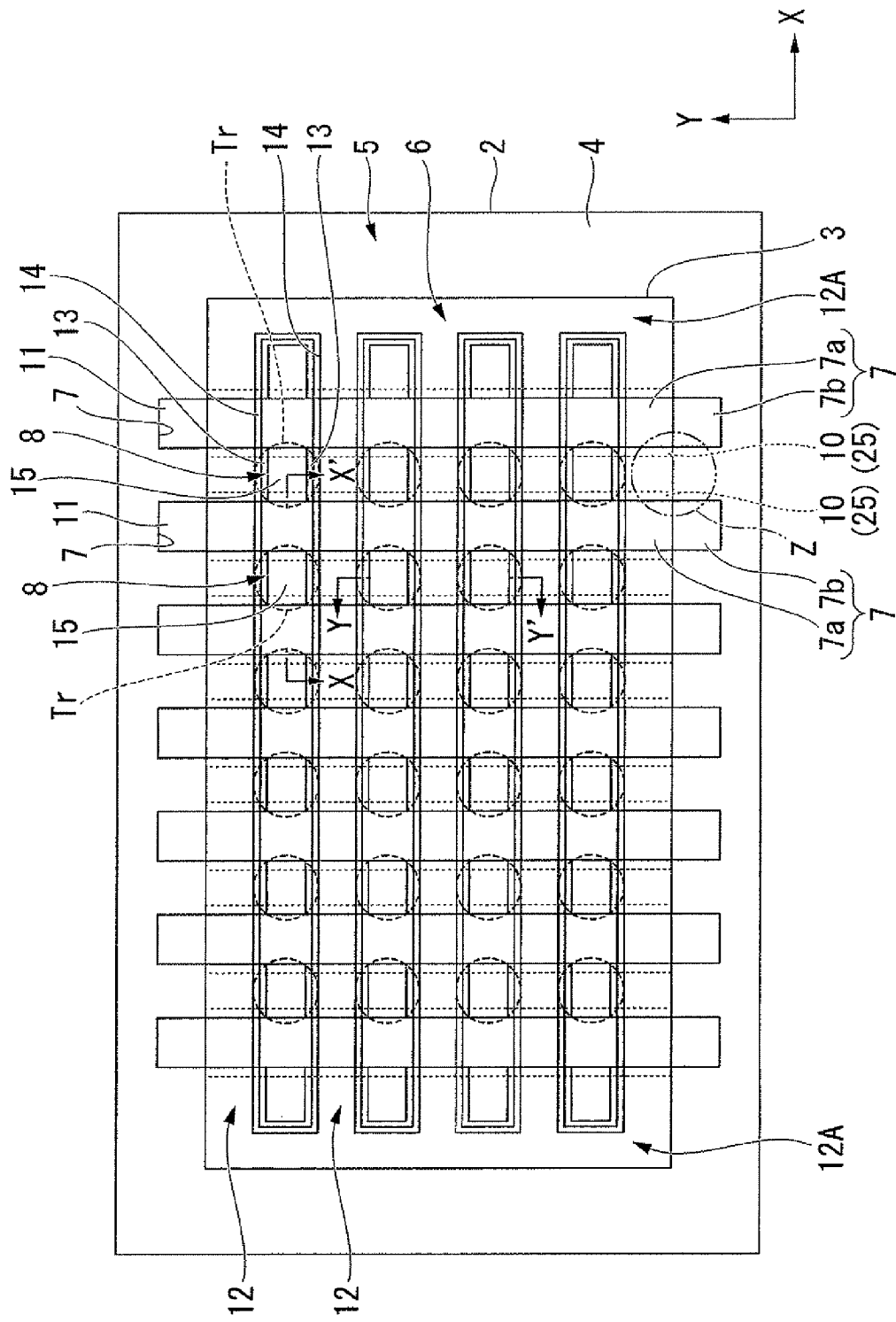
FIG. 1A is a fragmentary plan view illustrating a structure including a semiconductor device in accordance with one embodiment of the present invention.

FIG. 1A is a plan view illustrating a planar layout of the semiconductor device 1. FIG. 1B is a cross-sectional view illustrating the semiconductor device 1 taken along line Y-Y' of FIG. 1A. FIG. 1C is a cross-sectional view illustrating the semiconductor device 1 taken along line X-X' of FIG. 1A.

Figure 1B:
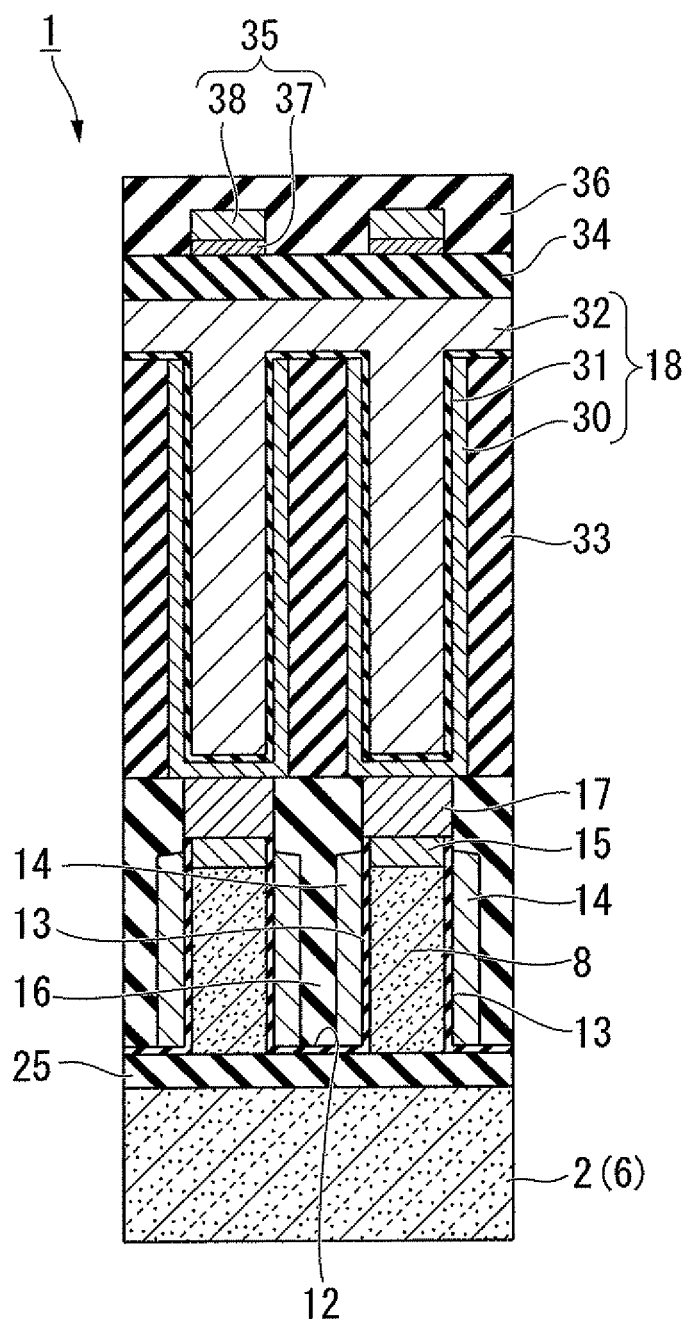
FIG. 1B is a fragmentary cross sectional elevation view, taken along an Y-Y' line of FIG. 1A, illustrating a memory cell in the semiconductor device in accordance with one embodiment of the present invention.
Figure 1C:
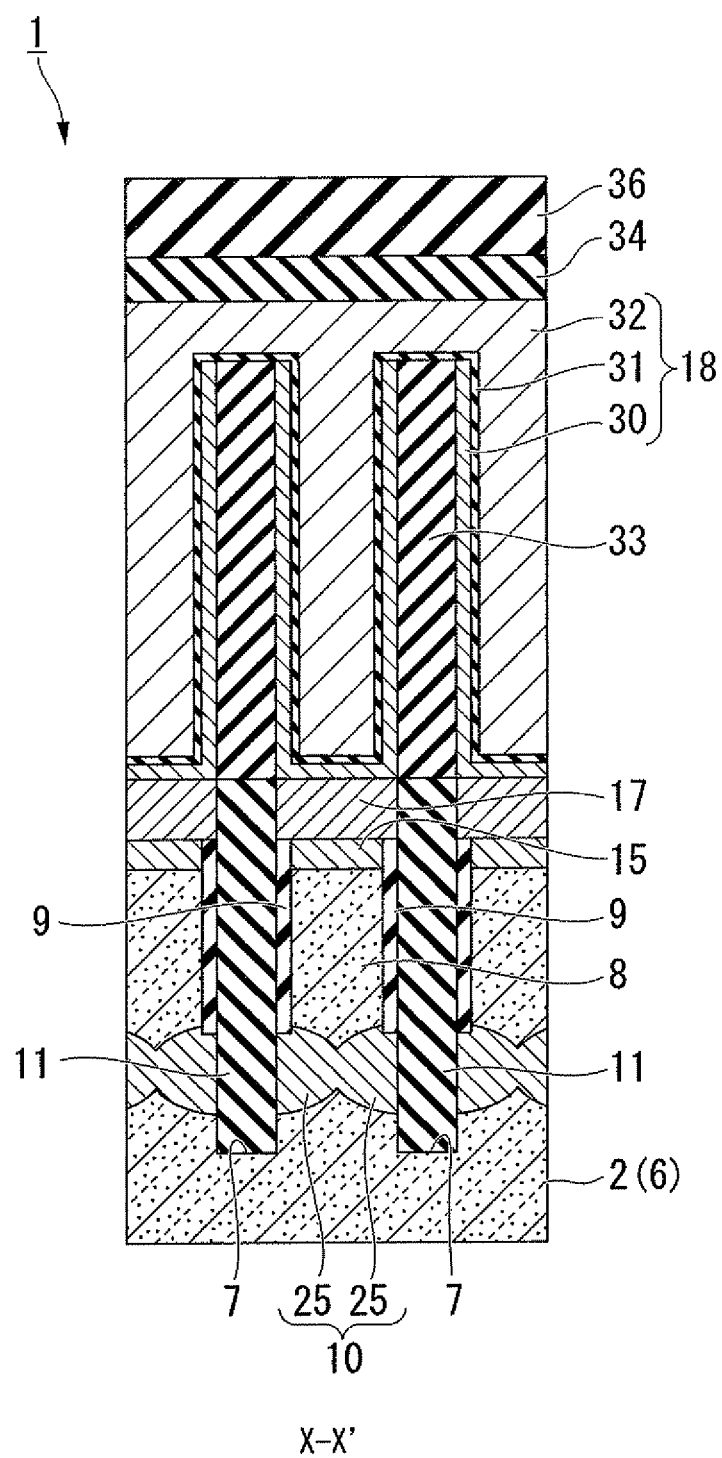
FIG. 1C is a fragmentary cross sectional elevation view, taken along an X-X' line of FIG. 1A, illustrating a memory cell in the semiconductor device in accordance with one embodiment of the present invention.

The semiconductor device 1 according to the present embodiment functions as a DRAM, as shown in FIGS. 1A to 1C. The semiconductor device 1 includes a lower portion 3, a rectangular frame-shaped device isolation region 5 (shallow trench isolation; STI, also refer to as an isolation region), and a rectangular-shaped device formation region 6 (also refer to as a semiconductor region). The lower portion 3 is provided for device isolation. The lower portion 3 is disposed within a surface of a semiconductor substrate 2. The lower portion 3 can be in the shape of a rectangular frame in plan view. The rectangular frame-shaped device isolation region 5 is defined by a device isolation insulating film 4 (silicon oxide film 20) disposed on the lower portion 3. The device isolation insulating film 4 shares the device isolation region 5. A rectangular-shaped device formation region 6 is defined by the device isolation region 5 or the device isolation insulating film 4. The rectangular-shaped device formation region 6 is surrounded by the device isolation region 5 or the device isolation insulating film 4. The surface of the device isolation insulating film 4 is aligned in level to the surface of the rectangular-shaped device formation region 6.

The semiconductor substrate 2 contains impurities. The semiconductor substrate 2 has a predetermined conductivity. In some cases, the semiconductor substrate 2 may be a silicon substrate containing impurities. The device isolation region 5 may be an STI within the surface of the semiconductor substrate. The device formation region 6 is surrounded by the device isolation region 5. The device formation region 6 is defined by the device isolation region 5.

The device formation region 6 has a plurality of stripe-shaped grooves 7 (first grooves) for bit line formation. The plurality of stripe-shaped grooves 7 extend in a first direction Y. The plurality of stripe-shaped grooves 7 are arranged side by side. A plurality of pillars 8 protrude between the grooves 7. The plurality of pillars 8 are formed in a fin shape. Sidewall films 9 are disposed on both side surfaces of each of the pillars 8 (groove 7 for bit line formation). The sidewall films 9 are located upper portion of side surfaces of each of the pillars 8. A buried bit line 10 formed of an impurity diffusion layer 25 is disposed below the sidewall film 9. The buried bit line 10 is formed by diffusing impurities in both side surfaces of the groove 7 for bit line formation (pillar 8).

In some cases, the buried bit line 10 may be the united impurity diffusion layers 25. The impurity diffusion layers 25 extend from both the side surfaces of the pillar 8 to each other so that the united impurity diffusion layers 25 are disposed in a lower portion of the pillar 8. The buried bit line 10 is formed by diffusing the impurities from the both side surfaces of the pillar 8 toward inside the lower portion of the pillar 8. The buried bit line 10 may be a single diffusion layer extending between the both the side surfaces of the pillar 8. In other cases, the buried bit line 10 may be the separated impurity diffusion layers 25. The separated impurity diffusion layers 25 extend from the both side surfaces of the pillar 8 toward inside the lower portion of the pillar 8. The buried bit line 10 may be two separate diffusion layers.

The bottom surface of the groove 7 for bit line formation is positioned lower than the buried bit line 10. The bottom surface of the groove 7 for bit line formation is positioned higher than the bottom of the device isolation region 5. The bottom surface of the groove 7 for bit line formation is positioned higher than the bottom surface of the lower portion 3 for device isolation. A first buried insulating film 11 is buried into each of the grooves 7 for bit line formation.

The device formation region 6 includes a plurality of stripe-shaped grooves 12 (second grooves) for gate electrode formation. The plurality of stripe-shaped grooves 12 extend in a second direction X which crosses (orthogonal to) the first direction Y. The plurality of stripe-shaped grooves 12 are arranged side by side. The plurality of stripe-shaped grooves 12 are positioned upper than the buried bit line 10. The plurality of pillars 8 are defined by the grooves 7 and 12. Due to this, the plurality of pillars 8 protrude from regions partitioned by the grooves 7 and 12. The plurality of pillars 8 are formed in a columnar shape. The protruding portions constitute vertical transistors Tr. Further, there are provided grooves 12A which extend in the first direction Y. Each groove 12A is provided inside the device isolation region 5. The groove 12A is provided outside the outermost pillar 8 included in the alignment in the second direction X of the pillars 8. The groove 12A extends in the first direction Y and between the device isolation region 5 and the outermost pillars 8 which are aligned in the first direction Y. The grooves 12A have the same depth as the grooves 12 for gate electrode formation.

There are gate insulating films 13 on the pillars 8. Each gate insulating film 13 is disposed on both side surfaces and bottom surface of the groove 12. There are gate electrodes 14 on the gate insulating films 13. Each pair of gate electrodes 14 (word line) is disposed on the paired side surfaces of the groove 12. The gate insulating film 13 is interposed between the gate electrode 14 and the side surface of the groove 12. That is, each of the vertical transistors Tr has a double gate structure in which the paired gate electrodes 14 are disposed in the opposite sides of the pillar 8. The word line, parts of which perform as pairs of the gate electrodes 14, extends in loop. The loop of the word line surrounds the alignment of pillars 8. The loop of the word line has a longitudinal direction in the second direction X.

An impurity diffusion layer 15 is provided by diffusing impurities into an upper portion of each of the pillars 8. A second buried insulating film 16 is buried in the groove 12 extending in the second direction X. The second buried insulating film 16 extends in the second direction X.

In the semiconductor device 1, the impurity diffusion layer 25 of the buried bit line 10 provided on the side surface of each of the pillars 8 functions as a source or drain of the vertical transistor Tr. The impurity diffusion layer 15 provided in the upper portion of each of the pillars 8 functions as a drain or source of the vertical transistor Tr. Due to this, the vertical transistors Tr respectively include the pillars 8 which are disposed in matrix in the device formation region 6.

The vertical transistor Tr has a smaller occupied area and is capable of complete depletion, which allows the vertical transistor Tr to have a larger drain current. Accordingly, the semiconductor device 1 including the vertical transistors Tr may have a close-packed layout known as a 4F2 (F being a minimum processing size).

The semiconductor device 1 includes a plurality of capacitors 18 connected to the impurity diffusion layers 15 of the respective vertical transistors Tr through contact plugs 17. The capacitor 18 has a stack of a lower electrode film 30, a capacitive insulating film 31, and an upper electrode film 32. The lower electrode film 30 has a hollow cylindrical shape with a closed bottom and an opened top. The lower electrode films 30 of the capacitors 18 are separated from each other by a first interlayer insulating film 33. The capacitive insulating film 31 covers a surface of the first interlayer insulating film 33 and the lower electrode film 30. The upper electrode film 32 covers an upper surface of the capacitive insulating film 31. The upper electrode film 32 fills hollow spaces surrounded by the lower electrode films 30. Whereas the capacitor of the semiconductor device is not limited to a cylinder type, the cylindrical capacitor 18 uses the inner surface of the lower electrode film 30 as an electrode. In other cases, the capacitor of the semiconductor device may be a crown-capacitor. The crown-capacitor may use the inner and outer surfaces of the lower electrode film as the electrode. In other cases, the capacitor of the semiconductor device may be differently shaped capacitor.

The semiconductor device 1 includes a second interlayer insulating film 34, a wiring layer 35 (barrier layer 37 and main wiring layer 38), and a third interlayer insulating film 36. The second interlayer insulating film 34 covers an upper surface of the upper electrode film 32. The wiring layer 35 (barrier layer 37 and main wiring layer 38) is formed on the second interlayer insulating film 34. The third interlayer insulating film 36 covers an upper surface on which the wiring layer 35 is formed The semiconductor device 1 includes a single memory cell configured of the above described vertical transistor Tr and the capacitor 18. Within the device formation region 6, a plurality of memory cells are arranged side by side in a matrix shape in the first and second directions Y and X.

A large number of memory cells are substantially arranged side by side in the device formation region 6. However, it is difficult to illustrate all memory cells in the planar layout of the semiconductor device 1 shown in FIG. 1. Accordingly, for convenience, the semiconductor device 1 is schematically shown that the reduced number of the memory cells are illustrated within the device formation region 6 (the same as in FIG. 16).

In the semiconductor device 1 according to the embodiment of the present invention, the groove 7 for bit line formation is formed to extend in the first direction Y. The both ends of the groove 7 for bit line formation reach the device isolation region 5 or the device isolation insulating film 4 sharing the device isolation region 5. In some cases, as shown in an enclosed dotted broken line Z of FIG. 1, the groove 7 for bit line formation extends beyond the boundaries of the device isolation region 5. The both ends of the groove 7 are positioned in the device isolation region 5 or the device isolation insulating film 4. In other cases, the groove 7 for bit line formation may be modified to be terminated by the boundaries of the device isolation region 5 so that the both ends of the groove 7 are in contact with the device isolation region 5 or the device isolation insulating film 4. In any cases, the groove 7 for bit line formation reaches the device isolation region 5 or the device isolation insulating film 4. In plan view, the grooves 7 for bit line formation extend in the first direction Y to divide the upper portion of the device formation region 6.

In this case, the buried bit lines 10 are terminated by the device insulating film 4. The buried bit lines 10 do not extend beyond the boundaries of the device isolation region 5. The buried bit line 10 may be a diffusion region extending from side surfaces of the grooves 7. The device isolation insulating film 4 is in contact with the both ends of the groove 7. The impurity diffusion is self-aligned to the end of the device insulating film 4. Two adjacent ends of the buried bit lines 10 are isolated and separated from each other by the presence of the groove portion 7b in the device isolation region 5.

Accordingly, the grooves 7 reaching the device isolation region 5 or the device isolation insulating film 4 will suppress impurity diffusion between two adjacent ends of the pillars 8. The suppression of the impurity diffusion will avoid short circuit formation between two adjacent ends of the pillars 8. The grooves 7 reaching the device isolation region 5 or the device isolation insulating film 4 will allow further reduction in distance between two adjacent pillars 8, while suppressing the impurity diffusion and short circuit formation between two adjacent ends of the pillars 8. The horizontal dimension of the vertical transistor Tr can be reduced.

Method of Manufacturing Semiconductor Device

Hereinafter, a method of manufacturing the semiconductor device 1 will be described.

The semiconductor device 1 is manufactured as follows. First, a semiconductor substrate 2 is prepared.

Figure 2A:
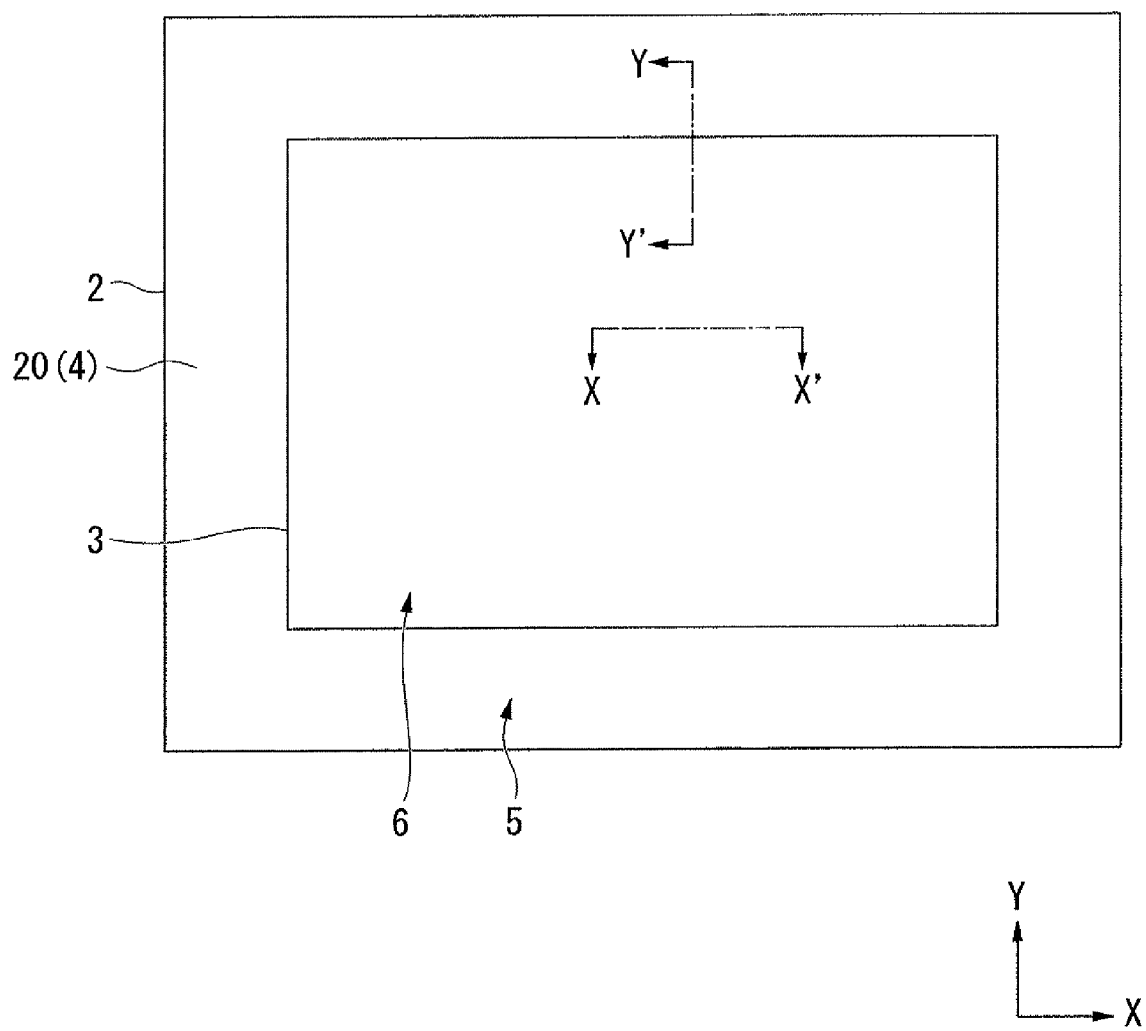
FIG. 2A is a fragmentary plan view illustrating a memory cell in a step involved in a method of forming the semiconductor device of FIGS. 1A to 1C in accordance with one embodiment of the present invention.
Figure 2B:
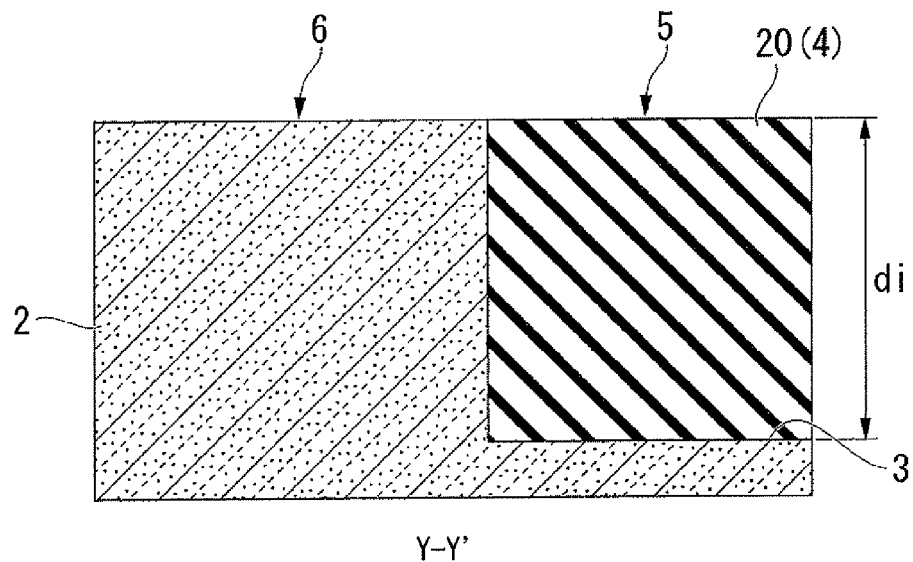
FIG. 2B is a fragmentary cross sectional elevation view, taken along an Y-Y' line of FIG. 2A, illustrating a memory cell in a step involved in a method of forming the semiconductor device of FIGS. 1A to 1C in accordance with one embodiment of the present invention.
Figure 2C:
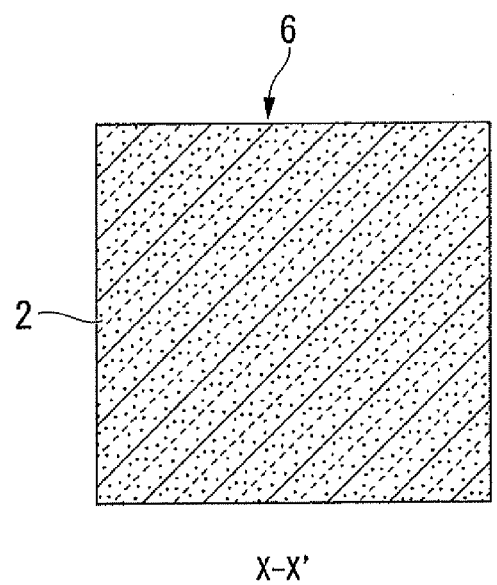
FIG. 2C is a fragmentary cross sectional elevation view, taken along an X-X' line of FIG. 2A, illustrating a memory cell in a step involved in a method of forming the semiconductor device of FIGS. 1A to 1C in accordance with one embodiment of the present invention.

FIG. 2A is a plan view of the present process. FIG. 2B is a cross-sectional view taken along line Y-Y' of FIG. 2A. FIG. 2C is a cross-sectional view taken along line X-X' of FIG. 2A. As shown in FIGS. 2A to 2C, the semiconductor substrate 2 is processed. The semiconductor substrate 2 is selectively removed to define a lower portion 3 for device isolation and a rectangular-shaped device formation region 6. The semiconductor substrate 2 includes the lower portion 3 and the rectangular-shaped device formation region 6. The lower portion 3 has a rectangular frame shape. A silicon oxide film 20 for forming a device isolation insulating film 4 is then buried in the lower portion 3. The device isolation insulating film 4 is formed to define a rectangular frame-shaped device isolation region 5 and a rectangular-shaped device formation region 6. The rectangular-shaped device formation region 6 is surrounded by the device isolation region 5. A P-type silicon substrate may be used as the semiconductor substrate 2. A depth di of the lower portion 3 for device isolation may be 350 nm.

Figure 3A:
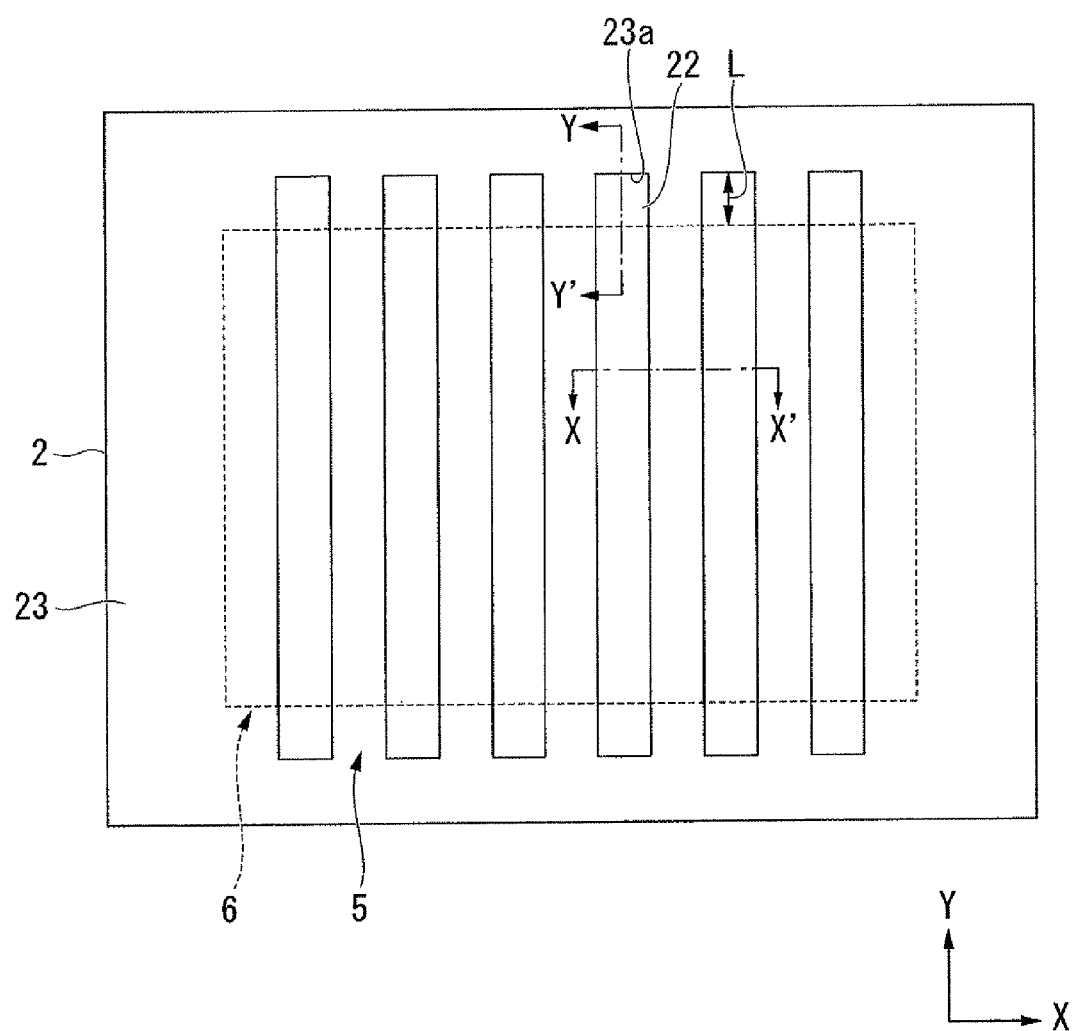
FIG. 3A is a fragmentary plan view illustrating a memory cell in a step, subsequent to the step of FIGS. 2A to 2C, involved in a method of forming the semiconductor device of FIGS. 1A to 1C in accordance with one embodiment of the present invention.
Figure 3B:
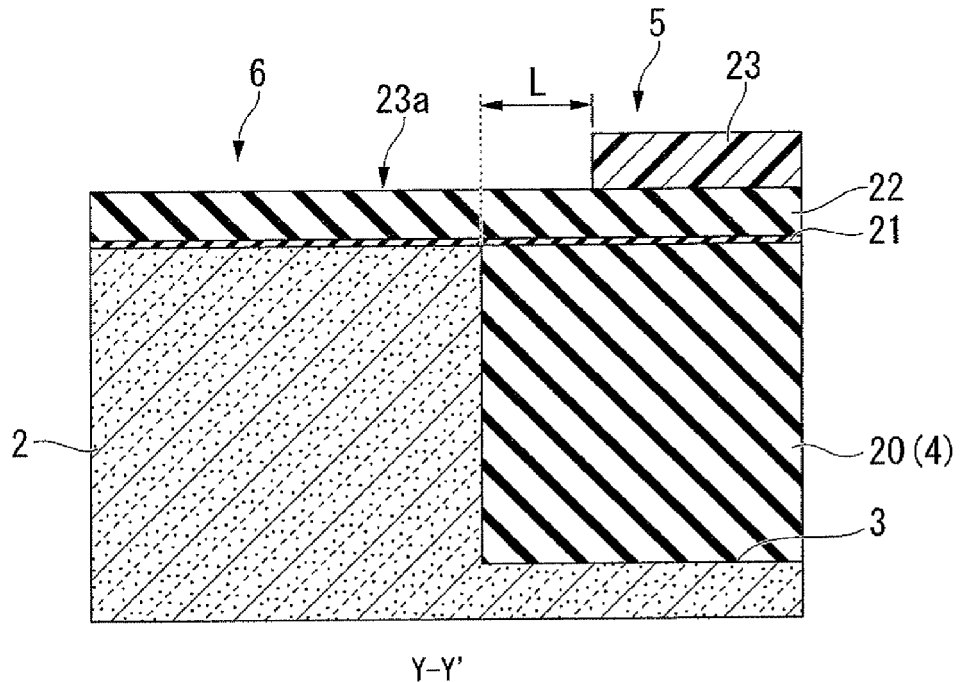
FIG. 3B is a fragmentary cross sectional elevation view, taken along an Y-Y' line of FIG. 3A, illustrating a memory cell in a step, subsequent to the step of FIGS. 2A to 2C, involved in a method of forming the semiconductor device of FIGS. 1A to 1C in accordance with one embodiment of the present invention.
Figure 3C:
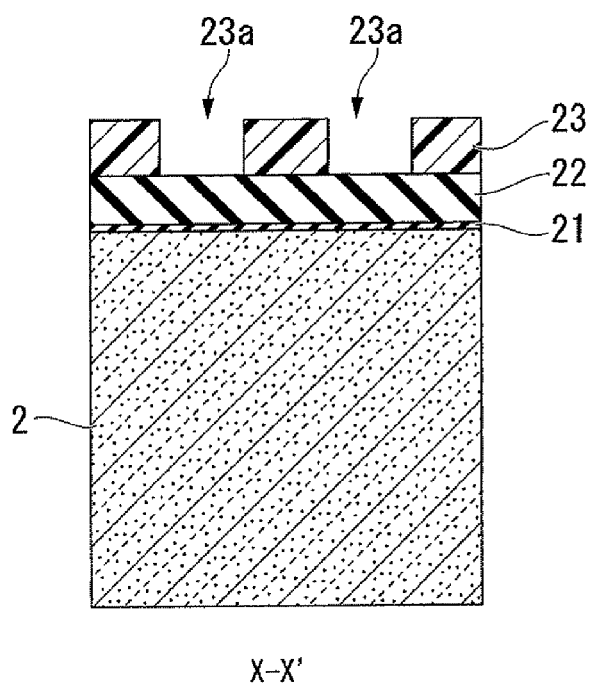
FIG. 3C is a fragmentary cross sectional elevation view, taken along an X-X' line of FIG. 3A, illustrating a memory cell in a step, subsequent to the step of FIGS. 2A to 2C, involved in a method of forming the semiconductor device of FIGS. 1A to 1C in accordance with one embodiment of the present invention.

FIG. 3A is a plan view of the present process. FIG. 3B is a cross-sectional view taken along line Y-Y' of FIG. 3A. FIG. 3C is a cross-sectional view taken along line X-X' of FIG. 3A. As shown in FIGS. 3A to 3C, a silicon oxide film 21 and a silicon nitride film 22 which cover an entire surface of the semiconductor substrate 2 are sequentially stacked using a CVD process. A resist pattern 23 is then formed on the silicon nitride film 22 using a photolithography technique. In this case, the resist pattern 23 has an opening 23a in an area in which a groove 7 for bit line formation is to be formed. The opening 23a is formed in a stripe shape extending in the first direction Y to correspond to the groove 7 for bit line formation. The opening 23a extends into a side of the device isolation region 5 so that the device formation region 6 is divided in the first direction Y. Further, the silicon oxide film 21 may be formed by a thermal oxidation process.

A width of the opening 23a of the resist pattern 23 is 50 nm. An interval between adjacent openings 23a is 50 nm. The opening 23a has opposite side portions which are positioned in the device isolation region 5. Each side portion has the length L which is defined in the first direction Y from the device formation region 6 to the end of the opening 23a. The length L may be, but is not limited to, 60 nm considering misalignment in aligning the resist pattern 23 over the semiconductor substrate 1. The length L may be decided by taking account that the opening 23a reaches the device isolation region 5 even misalignment occurs.

Figure 4A:
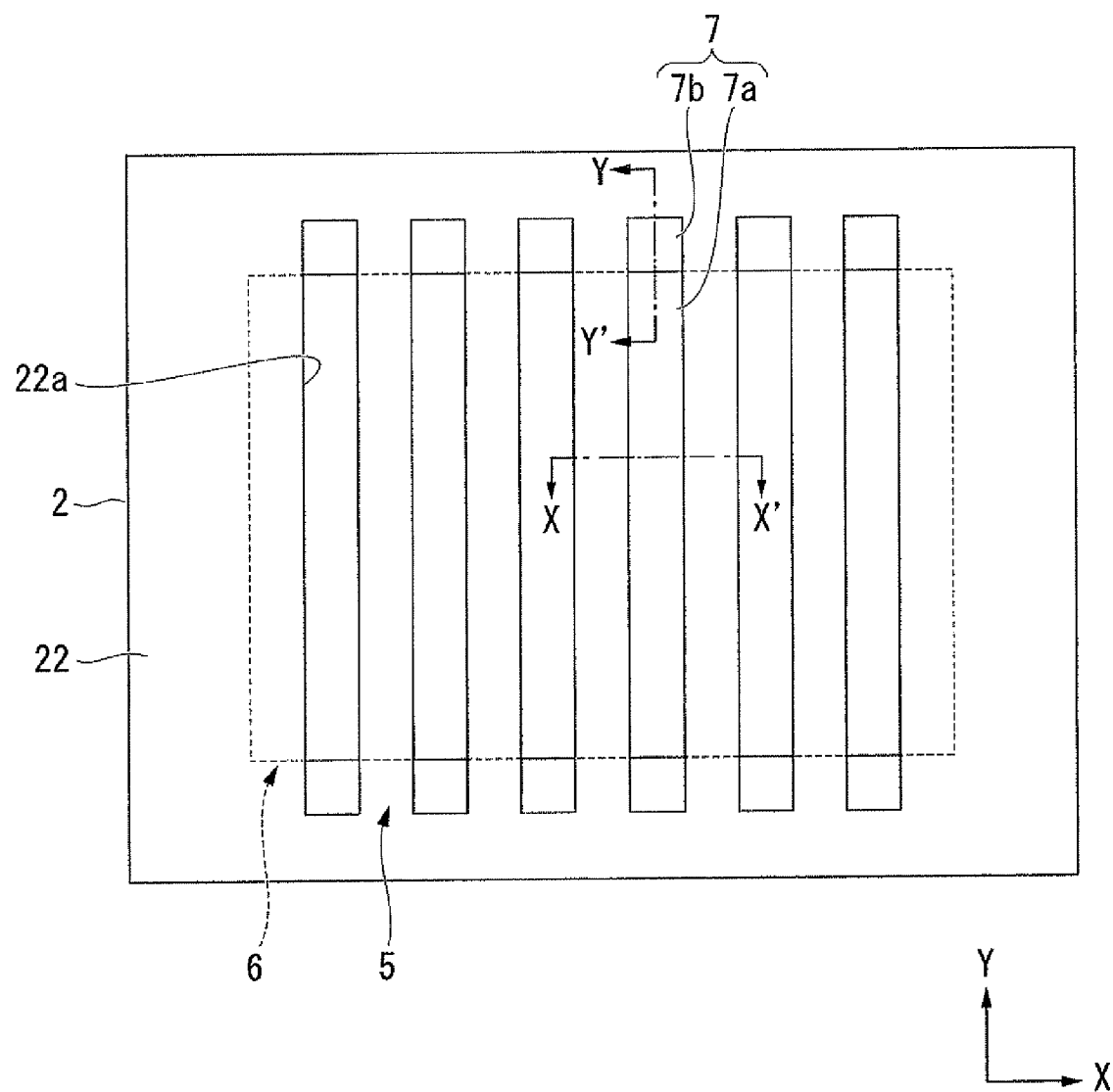
FIG. 4A is a fragmentary plan view illustrating a memory cell in a step, subsequent to the step of FIGS. 3A to 3C, involved in a method of forming the semiconductor device of FIGS. 1A to 1C in accordance with one embodiment of the present invention.
Figure 4B:
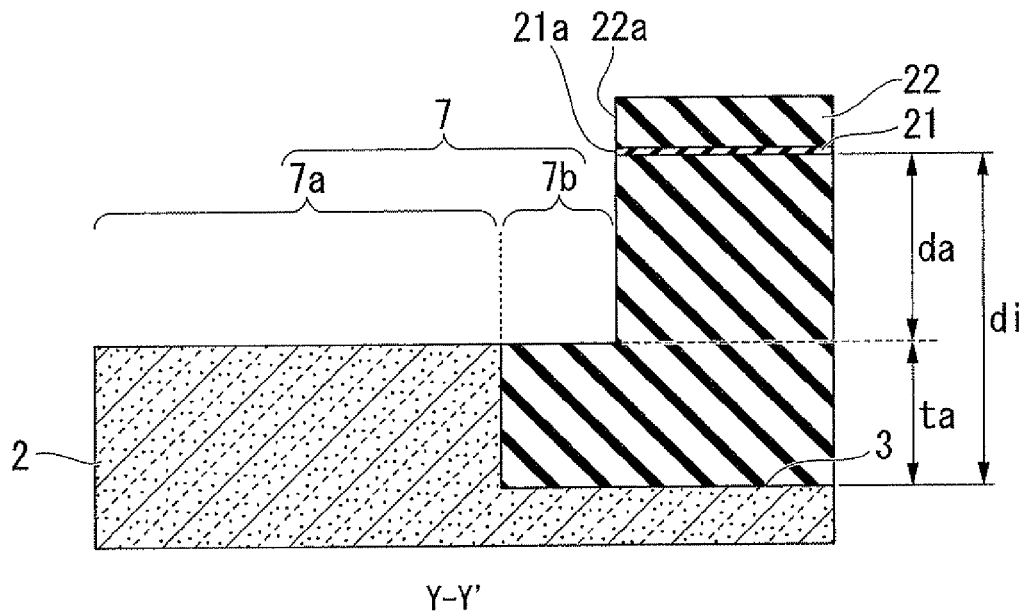
FIG. 4B is a fragmentary cross sectional elevation view, taken along an Y-Y' line of FIG. 4A, illustrating a memory cell in a step, subsequent to the step of FIGS. 3A to 3C, involved in a method of forming the semiconductor device of FIGS. 1A to 1C in accordance with one embodiment of the present invention.
Figure 4C:
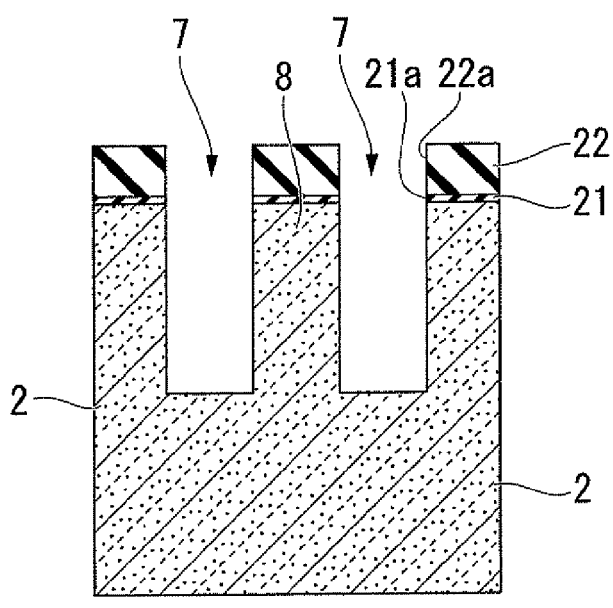
FIG. 4C is a fragmentary cross sectional elevation view, taken along an X-X' line of FIG. 4A, illustrating a memory cell in a step, subsequent to the step of FIGS. 3A to 3C, involved in a method of forming the semiconductor device of FIGS. 1A to 1C in accordance with one embodiment of the present invention.

FIG. 4A is a plan view of the present process. FIG. 4B is a cross-sectional view taken along line Y-Y' of FIG. 4A. FIG. 4C is a cross-sectional view taken along line X-X' of FIG. 4A. As shown in FIGS. 4A to 4C, the silicon nitride film 22 and the silicon oxide film 21 are patterned by an anisotropic dry etching process using the resist pattern 23. In this instance, the resist pattern 23 is removed from the top of the silicon nitride film 22 by the etching process. However, a shape of the resist pattern 23 is transferred directly onto the silicon nitride film 22 and the silicon oxide film 21. Due to this, it is possible to pattern the silicon nitride film 22 and the silicon oxide film 21 into a shape corresponding to the resist pattern 23. Openings 22a and 21a are formed, which penetrate the silicon nitride film 22 and the silicon oxide film 21. The openings 22a and 21a are formed for forming the groove 7 for bit line formation.

The device formation region 6 and the device isolation region 5 shown through the openings 22a and 21a are patterned by the anisotropic dry etching process using the patterned silicon nitride film 22 and silicon oxide film 21 as masks. Due to this, a plurality of stripe-shaped grooves 7 for bit line formation extending in the first direction Y are arranged side by side on the surface of the semiconductor substrate 2. Fin shaped semiconductor regions for forming pillars 8 are defined by the grooves 7 for bit line formation. The fin shaped semiconductor regions extend in the first direction Y.

Each groove 7 includes groove portions 7a and 7b. Here, the groove portion 7a is positioned in the device formation region 6. The groove portion 7b is positioned in the device isolation region 5. The groove portions 7a and 7b may have the same depth. In other cases, the depth of the groove portion 7b may be deeper than that of the groove portion 7a. This is because, if the groove portion 7a is deeper than the groove portion 7b, in the later steps, a silicon nitride film 24 used for forming the sidewall film 9 is deposited to cover a stepped portion formed between the groove portions 7a and 7b in the process shown in FIGS. 5A and 5B. In this case, in the later step shown in FIGS. 7A and 7B, digging the groove 7 deeper is necessary to divide a deeper impurity diffusion layer 25 performing as the buried bit line 10. Due to this, the buried bit lines 10 adjacent to each other in the second direction X are shorted (short) if the deeper impurity diffusion layer 25 is not divided.

Assuming that the depth of the groove portion 7a formed in the device formation region 6 is 'da', and the difference in level between a bottom surface of the groove portion 7a and a bottom surface of the lower portion 3 for device isolation is 'ta', the depth di of the lower portion 3 for device isolation is given by 'da+ta'. The depth 'da' is set in accordance with a gate length of a gate electrode 14 to be formed in the later step shown in FIGS. 11A through 11E. The level difference 'ta' is set to secure a withstand voltage between the buried bit lines 10 adjacent to each other in the second direction X through the semiconductor substrate 2 positioned in the bottom surface of the lower portion 3 for device isolation. Preferably, the upper surface of the lower portion 3 for device isolation is lower than the buried bit line 10. The depth 'da' may be set to 200 nm, and the level difference 'ta' may be set to 150 nm.

Figure 7A:
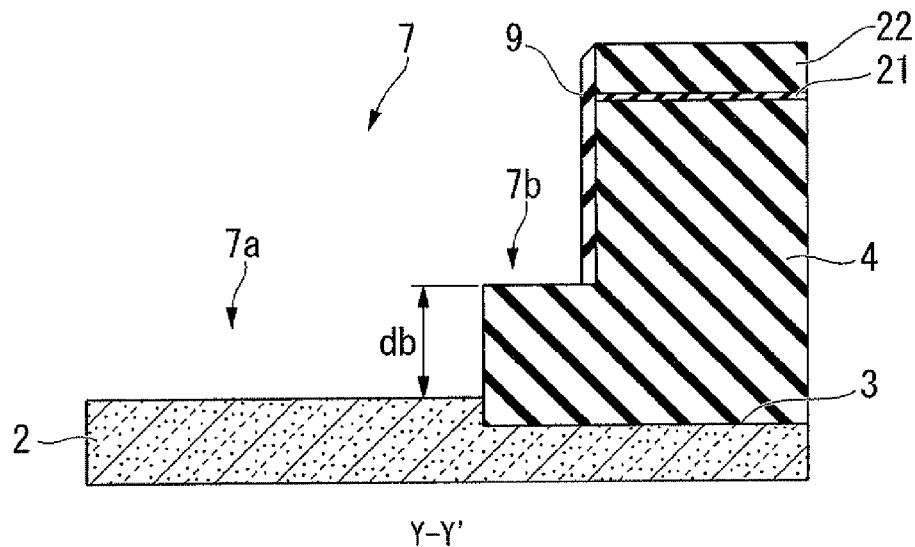
FIG. 7A is a fragmentary cross sectional elevation view, taken along an Y-Y' line of FIG. 4A, illustrating a memory cell in a step, subsequent to the step of FIGS. 6A and 6B, involved in a method of forming the semiconductor device of FIGS. 1A to 1C in accordance with one embodiment of the present invention.
Figure 7B:
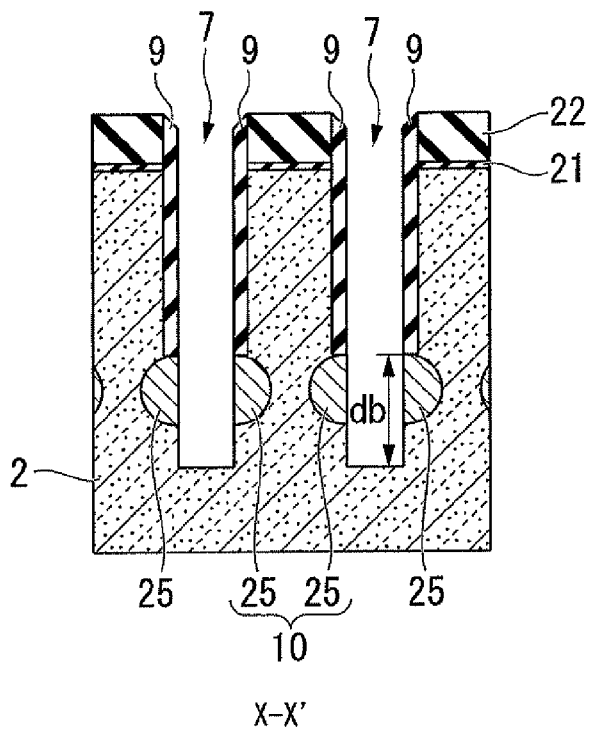
FIG. 7B is a fragmentary cross sectional elevation view, taken along an X-X' line of FIG. 4A, illustrating a memory cell in a step, subsequent to the step of FIGS. 6A and 6B, involved in a method of forming the semiconductor device of FIGS. 1A to 1C in accordance with one embodiment of the present invention.

In the process shown in FIGS. 7A and 7B, if the groove is further dug by etching process using the sidewall film 9 as a mask and a lower side surface of the sidewall film 9 is removed by isotropic etching process, then the short circuit formation between two adjacent buried bit lines 10 can be avoided. In this case, it is not necessary that the depth of the groove portion 7a is the same as or deeper than that of the groove portion 7b. The groove portion 7a is formed in the device formation region 6. The groove portion 7b is formed in the device isolation region 5. In this case, the groove portion 7a of the groove 7 for bit line formation may be formed only in the device formation region 6 without forming the groove portion 7b in the device isolation region 5.

Figure 5A:
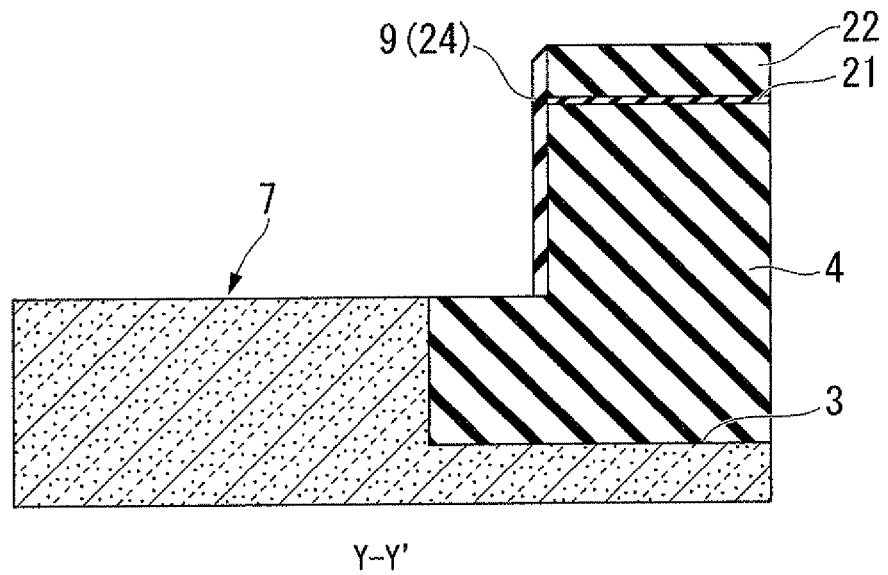
FIG. 5A is a fragmentary cross sectional elevation view, taken along an Y-Y' line of FIG. 4A, illustrating a memory cell in a step, subsequent to the step of FIGS. 4A to 4C, involved in a method of forming the semiconductor device of FIGS. 1A to 1C in accordance with one embodiment of the present invention.
Figure 5B:
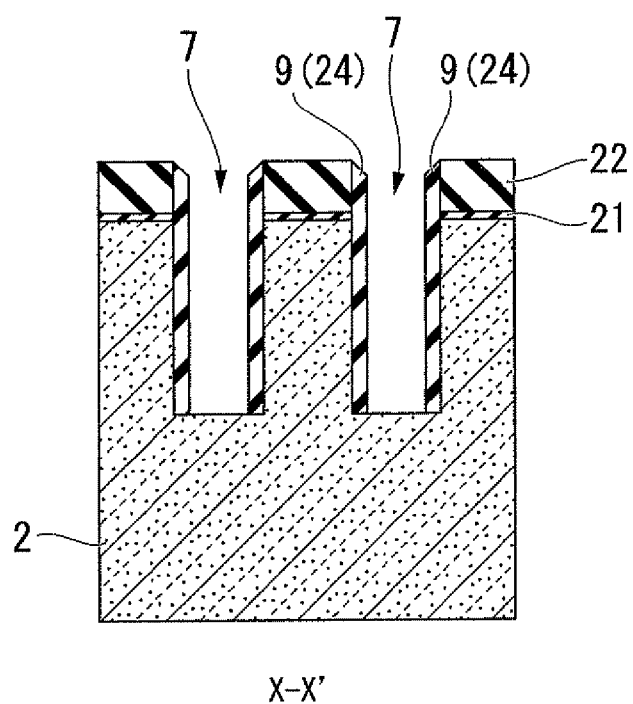
FIG. 5B is a fragmentary cross sectional elevation view, taken along an X-X' line of FIG. 4A, illustrating a memory cell in a step, subsequent to the step of FIGS. 4A to 4C, involved in a method of forming the semiconductor device of FIGS. 1A to 1C in accordance with one embodiment of the present invention.

FIG. 5A is a cross-sectional view of the present process taken along line Y-Y' of FIG. 4A. FIG. 5B is a cross-sectional view of the present process taken along line X-X' of FIG. 4A. As shown in FIGS. 5A to 5B, the sidewall films 9 are formed on both side surfaces of the groove 7 for bit line formation. The sidewall films 9 are formed as follows. The silicon nitride film 24 is formed to have a thickness at which the silicon nitride film 24 is not completely buried in the groove 7. The deposited silicon nitride film 24 is etched using the anisotropic dry etching process to have the deposited silicon nitride film 24 remain only on the side surfaces of the groove 7. The remaining silicon nitride films 24 perform as the sidewall films 9.

Figure 6A:
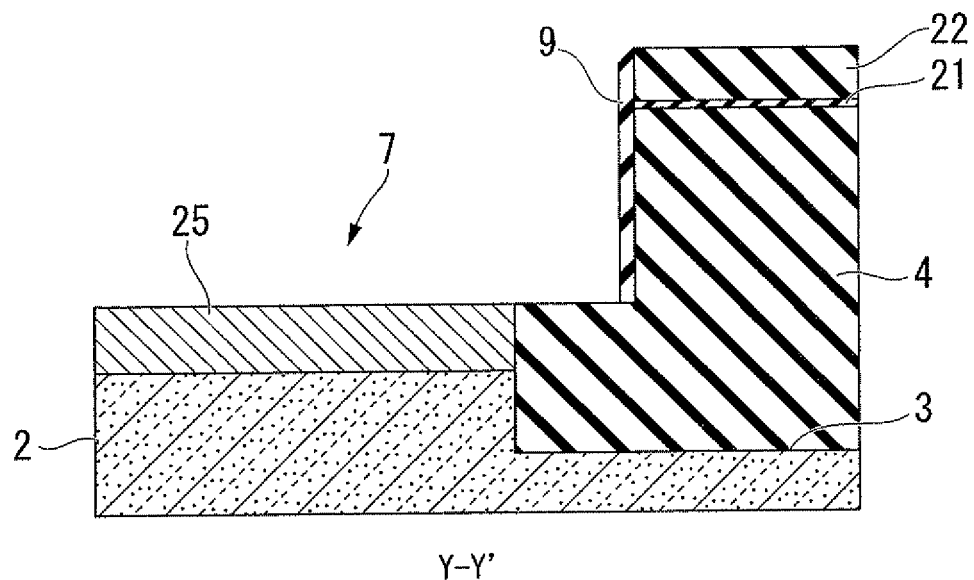
FIG. 6A is a fragmentary cross sectional elevation view, taken along an Y-Y' line of FIG. 4A, illustrating a memory cell in a step, subsequent to the step of FIGS. 5A and 5B, involved in a method of forming the semiconductor device of FIGS. 1A to 1C in accordance with one embodiment of the present invention.
Figure 6B:
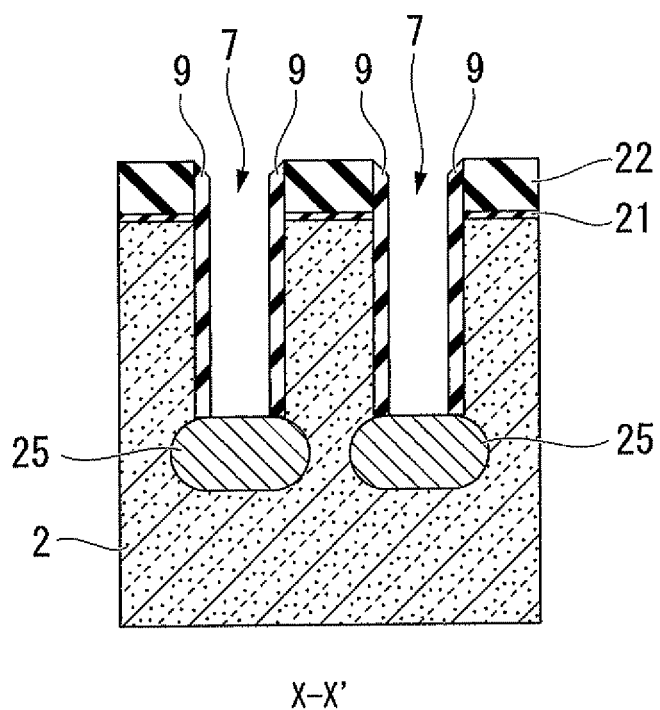
FIG. 6B is a fragmentary cross sectional elevation view, taken along an X-X' line of FIG. 4A, illustrating a memory cell in a step, subsequent to the step of FIGS. 5A and 5B, involved in a method of forming the semiconductor device of FIGS. 1A to 1C in accordance with one embodiment of the present invention.

As shown in FIGS. 6A to 6B, the impurity diffusion layer 25 is formed by introducing an impurity into the bottom surface of the groove 7 for bit line formation, using an ion implantation method. In this instance, the impurity diffusion layer 25 is formed while the impurity is diffused from the bottom surface of the groove 7 to the pillar 8.

FIG. 6A is a cross-sectional view of the present process taken along line Y-Y' of FIG. 4A. FIG. 6B is a cross-sectional view of the present process taken along line X-X' of FIG. 4A. The impurity concentration of the impurity diffusion layer 25 is set to satisfy the condition for the post-diffusion resistance of the impurity diffusion layer 25, wherein the diffusion process in the pillars 8 will be performed later. The dosage of the ion implantation is set in order for the impurity concentration to be set as above. The ion implantation of impurity is carried out to introduce the impurity from the bottom surface of the groove 7b in the device isolation region 5. Therefore, an implantation energy and the level difference 'ta' are set so that the impurity cannot penetrate the device isolation insulating film 4 and be introduced to the semiconductor substrate 2. The groove 7 is formed to be shallower than the lower portion 3 for device isolation. The implantation energy may be 5 KeV, and the dosage may be $1 \times 10^{15}$ atoms/cm$^2$ using arsenic as the impurity.

In the present process, it is preferable to perform a heat treatment after the ion implantation to diffuse the impurities implanted in the bottom surface of the groove 7 to the pillars 8 to increase the impurity concentration of the portion of the pillars 8. As other methods of introducing the impurities, for example, a diffusion process or a plasma doping process may be used other than the ion implantation process.

FIG. 7A is a cross-sectional view of the present process taken along line Y-Y' of FIG. 4A. FIG. 7B is a cross-sectional view of the present process taken along line X-X' of FIG. 4A. As shown in FIGS. 7A to 7B, the impurity diffusion layer 25 is divided by further digging down the groove 7 using the anisotropic dry etching process. Due to this, the buried bit line 10 formed of the impurity diffusion layer 25 is formed. The buried bit line 10 is formed within a lower portion of the pillar 8, the lower portion being positioned below the sidewall film 9 while the divided impurity diffusion layers 25 are positioned in the lower portion of the pillar 8.

As shown in FIG. 7A, there is a level difference 'db' between the lower surface of the groove 7 before digging process and that after the digging process. The lower surface of the groove after digging down is deeper than the buried bit line 10. Further, the level difference 'db' is set to ensure that the buried bit lines 10 adjacent to each other in the second direction X are not in contact with each other to prevent short circuit formation between the buried bit lines 10. The level difference 'db' may be set to be 120 nm.

Figure 8A:
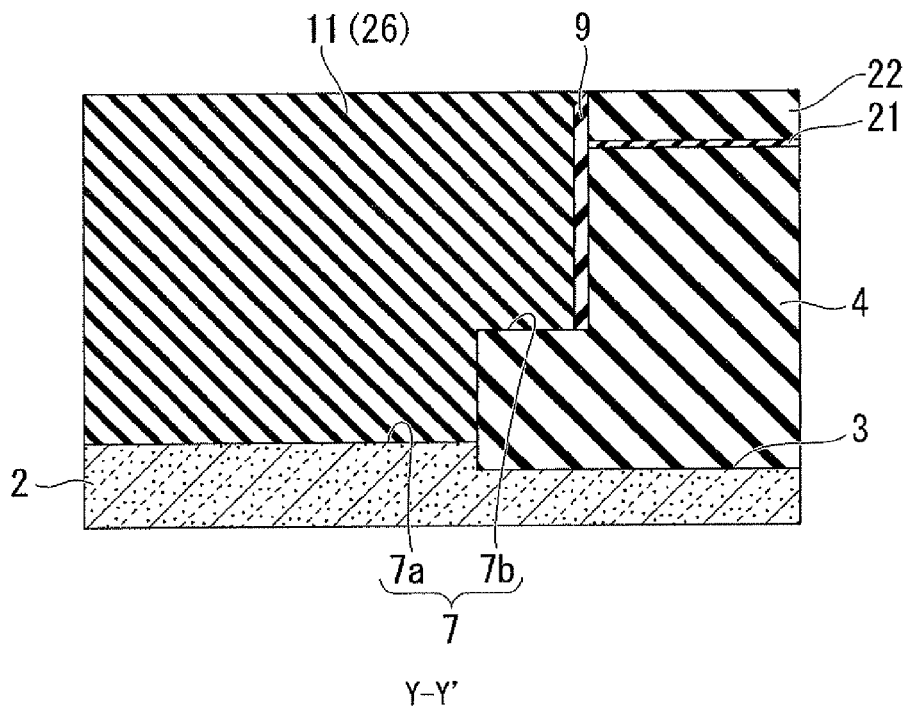
FIG. 8A is a fragmentary cross sectional elevation view, taken along an Y-Y' line of FIG. 4A, illustrating a memory cell in a step, subsequent to the step of FIGS. 7A and 7B, involved in a method of forming the semiconductor device of FIGS. 1A to 1C in accordance with one embodiment of the present invention.
Figure 8B:
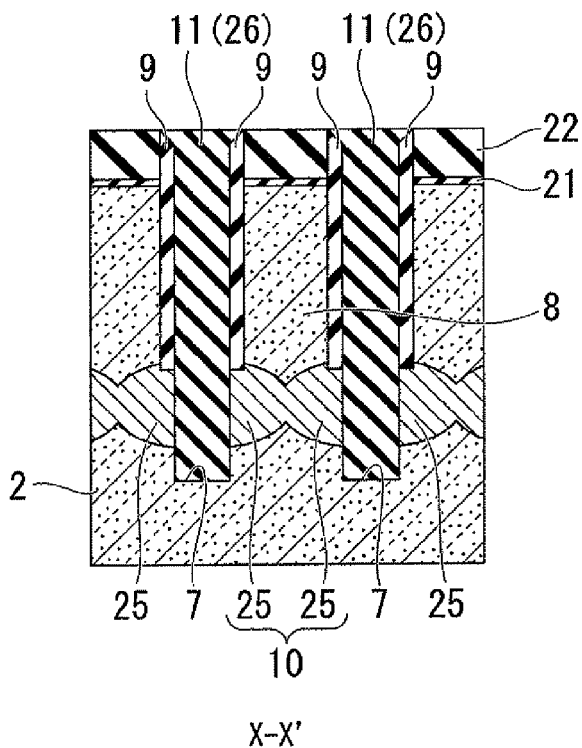
FIG. 8B is a fragmentary cross sectional elevation view, taken along an X-X' line of FIG. 4A, illustrating a memory cell in a step, subsequent to the step of FIGS. 7A and 7B, involved in a method of forming the semiconductor device of FIGS. 1A to 1C in accordance with one embodiment of the present invention.

FIG. 8A is a cross-sectional view of the present process taken along line Y-Y' of FIG. 4A. FIG. 8B is a cross-sectional view of the present process taken along line X-X' of FIG. 4A. As shown in FIGS. 8A to 8B, a silicon oxide film 26 is deposited to have a sufficient thickness to be buried in the groove 7 (7a and 7b) over the entire surface of the semiconductor substrate 2, using a high density plasma-chemical vapor deposition (HDP-CVD) method. Planarization is then performed to the surface of the silicon oxide film 26 by polishing using a chemical mechanical polishing (CMP) process. The planarization is continued until the surface of the silicon nitride film 22 acting as a stopper is exposed.

Due to this, the planarization of the silicon oxide film 26 will form a first buried insulating film 11 in the groove 7 for bit line formation.

By performing a heat treatment, activation for the impurity diffusion layer 25 is caused. The impurity is diffused from the both side surfaces of the pillar 8 to form the buried bit line 10 in which the impurity diffusion layers 25 are coupled within the pillar 8. A rapid heat treatment process may be performed under conditions of 1000° C. for 10 seconds. After the heat treatment is performed, the thickness of the buried bit line 10 in the vicinity of the first buried insulating film 11 may be about 70 nm at almost maximum.

This heat treatment may be performed any time after introducing the impurity shown in FIG. 6 even it is preferable to adjust the conditions for the heat treatment taking into account influences on an impurity diffusion layer 15 or a contact plug 17, which are formed in the later steps. For example, an annealing process of the insulating layer or a deposition process at a high temperature may be performed instead of the heat treatment mentioned above. It is possible to avoid re-diffusion of the impurity in the impurity diffusion layer 25 constituting the buried bit line 10, by performing post-diffusion heat treatments at lower temperatures after the heat treatment for impurity diffusion.

Figure 9A:
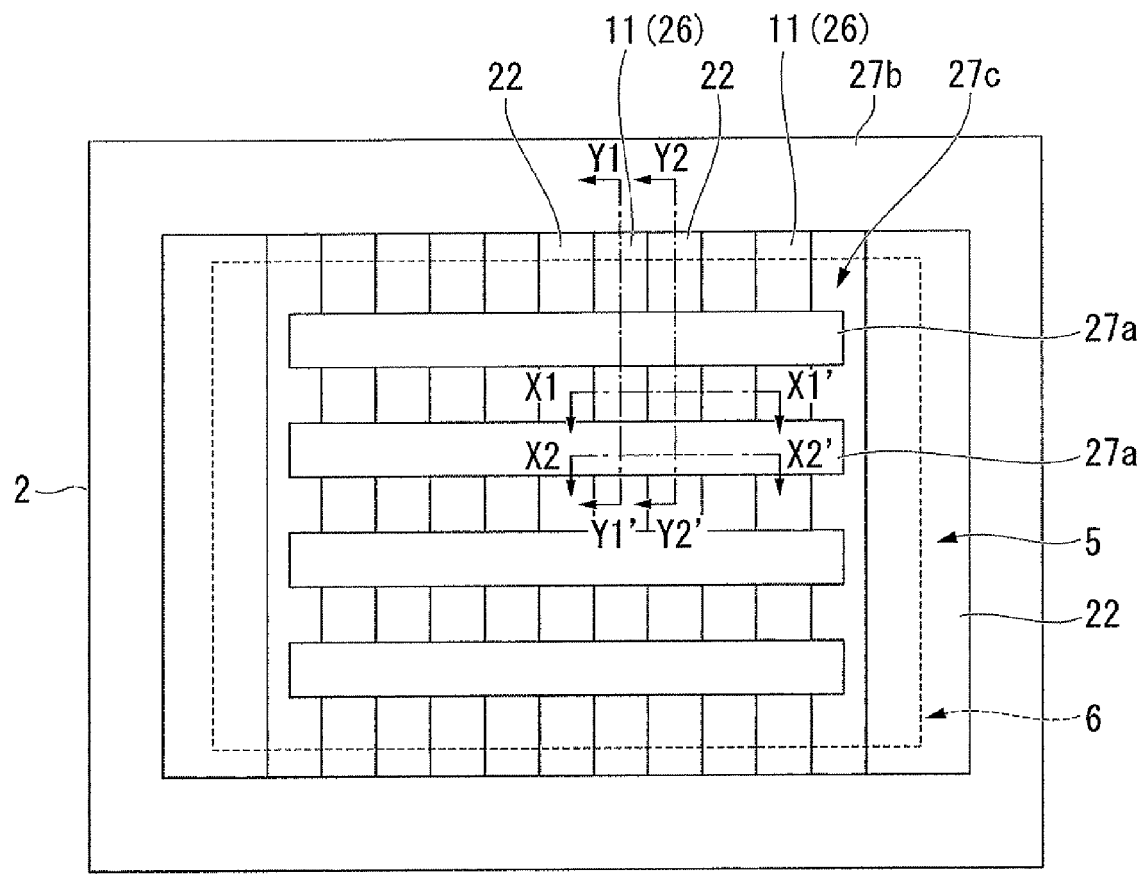
FIG. 9A is a fragmentary plan view illustrating a memory cell in a step, subsequent to the step of FIGS. 8A and 8B, involved in a method of forming the semiconductor device of FIGS. 1A to 1C in accordance with one embodiment of the present invention.
Figure 9A:
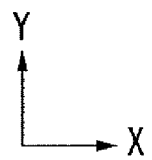
Figure 9B:
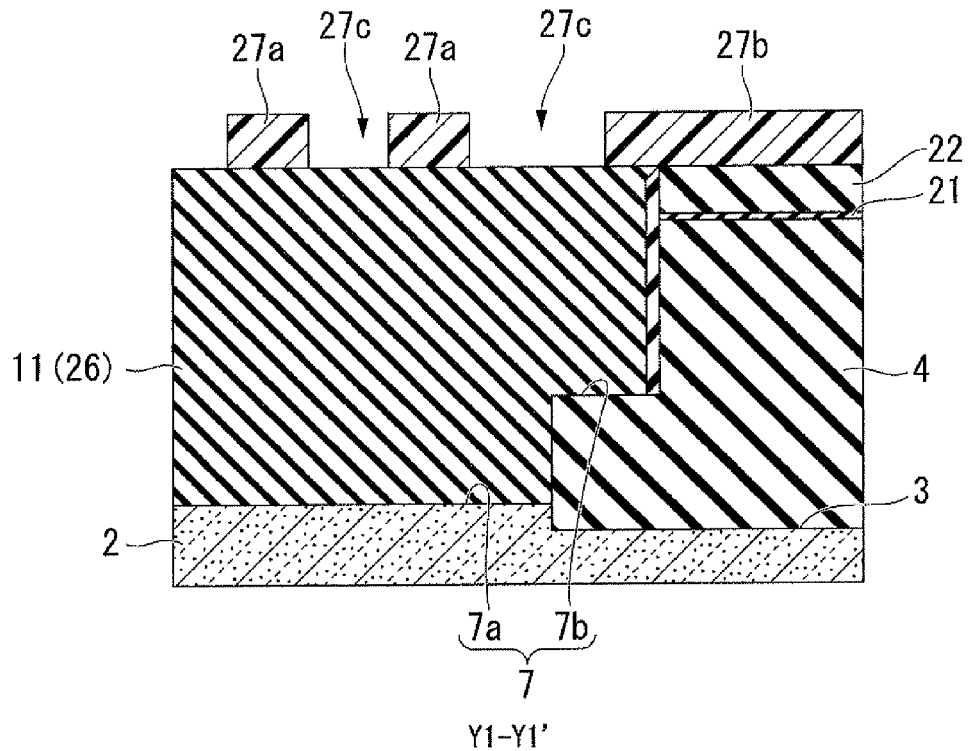
FIG. 9B is a fragmentary cross sectional elevation view, taken along an Y1-Y1' line of FIG. 9A, illustrating a memory cell in a step, subsequent to the step of FIGS. 8A and 8B, involved in a method of forming the semiconductor device of FIGS. 1A to 1C in accordance with one embodiment of the present invention.
Figure 9C:
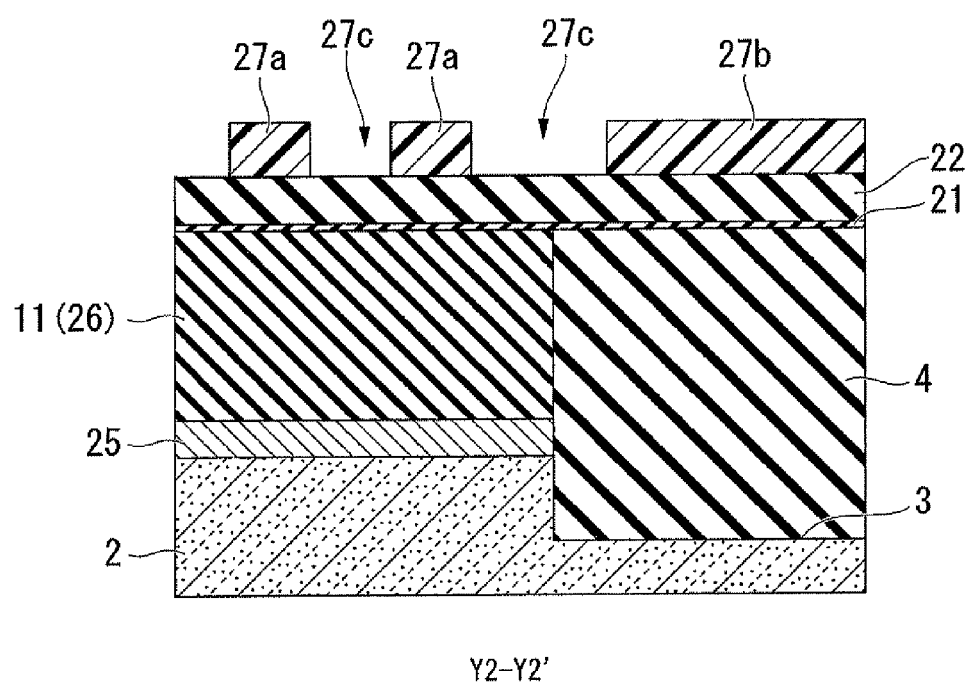
FIG. 9C is a fragmentary cross sectional elevation view, taken along an Y2-Y2' line of FIG. 9A, illustrating a memory cell in a step, subsequent to the step of FIGS. 8A and 8B, involved in a method of forming the semiconductor device of FIGS. 1A to 1C in accordance with one embodiment of the present invention.
Figure 9D:
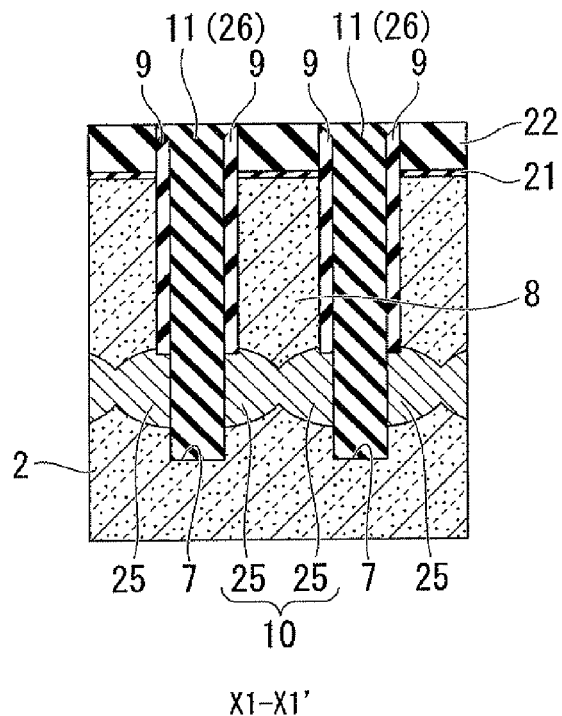
FIG. 9D is a fragmentary cross sectional elevation view, taken along an X1-X1' line of FIG. 9A, illustrating a memory cell in a step, subsequent to the step of FIGS. 8A and 8B, involved in a method of forming the semiconductor device of FIGS. 1A to 1C in accordance with one embodiment of the present invention.
Figure 9E:
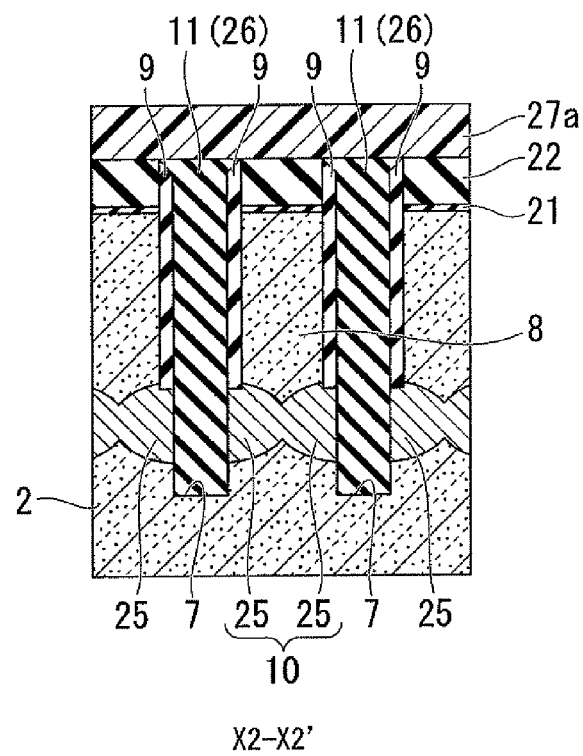
FIG. 9E is a fragmentary cross sectional elevation view, taken along an X2-X2' line of FIG. 9A, illustrating a memory cell in a step, subsequent to the step of FIGS. 8A and 8B, involved in a method of forming the semiconductor device of FIGS. 1A to 1C in accordance with one embodiment of the present invention.

FIG. 9A is a plan view of the present process. FIG. 9B is a cross-sectional view taken along line Y1-Y1' of FIG. 9A. FIG. 9C is a cross-sectional view taken along line Y2-Y2' of FIG. 9A. FIG. 9D is a cross-sectional view taken along line X1-X1' of FIG. 9A. FIG. 9E is a cross-sectional view taken along line X2-X2' of FIG. 9A. As shown in FIGS. 9A to 9E, a plurality of first resist patterns 27a, extending in the second direction X in the device formation region 6, are arranged side by side on the semiconductor substrate 2. A rectangular frame-shaped second resist pattern 27b, surrounding the plurality of first resist patterns 27a, is formed in the device isolation region 5 using the photolithography technique. An opening 27c used for forming a groove 12 for gate electrode formation and a groove 12A is formed in a portion which does not covered by the resist patterns 27a and 27b. A width of the first resist pattern 27a may be 50 nm, and an interval between the first resist patterns 27a adjacent to each other may be 50 nm.

Figure 10A:
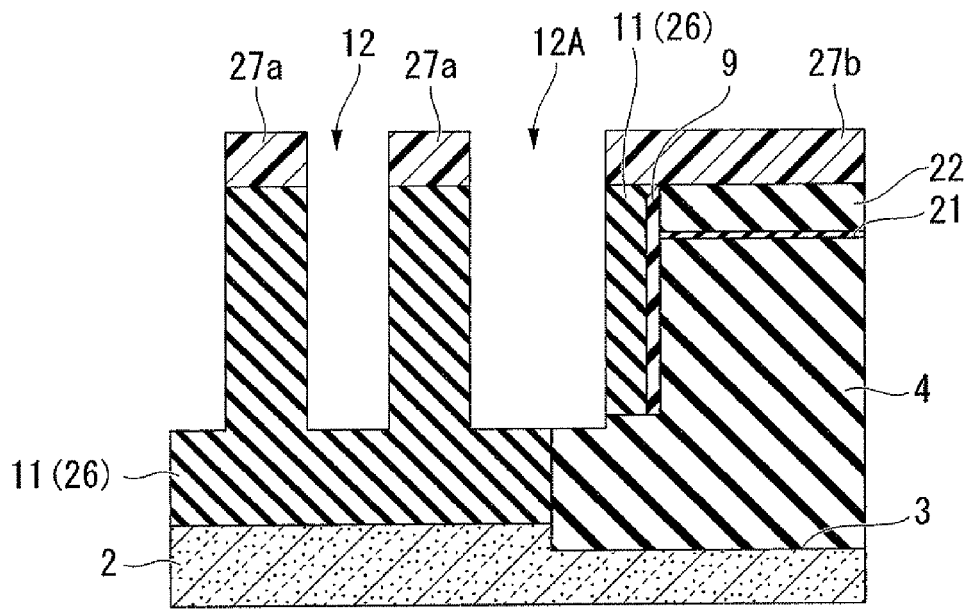
FIG. 10A is a fragmentary cross sectional elevation view, taken along an Y1-Y1' line of FIG. 9A, illustrating a memory cell in a step, subsequent to the step of FIGS. 9A to 9E, involved in a method of forming the semiconductor device of FIGS. 1A to 1C in accordance with one embodiment of the present invention.
Figure 10B:
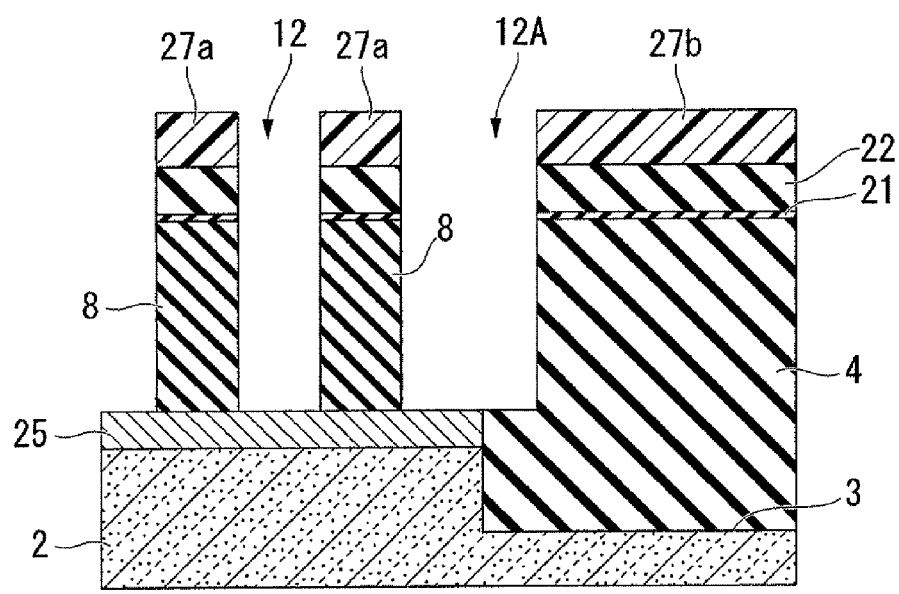
FIG. 10B is a fragmentary cross sectional elevation view, taken along an Y2-Y2' line of FIG. 9A, illustrating a memory cell in a step, subsequent to the step of FIGS. 9A to 9E, involved in a method of forming the semiconductor device of FIGS. 1A to 1C in accordance with one embodiment of the present invention.
Figure 10C:
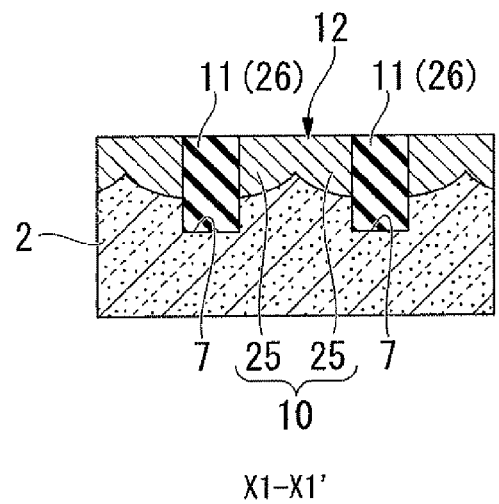
FIG. 10C is a fragmentary cross sectional elevation view, taken along an X1-X1' line of FIG. 9A, illustrating a memory cell in a step, subsequent to the step of FIGS. 9A to 9E, involved in a method of forming the semiconductor device of FIGS. 1A to 1C in accordance with one embodiment of the present invention.
Figure 10D:
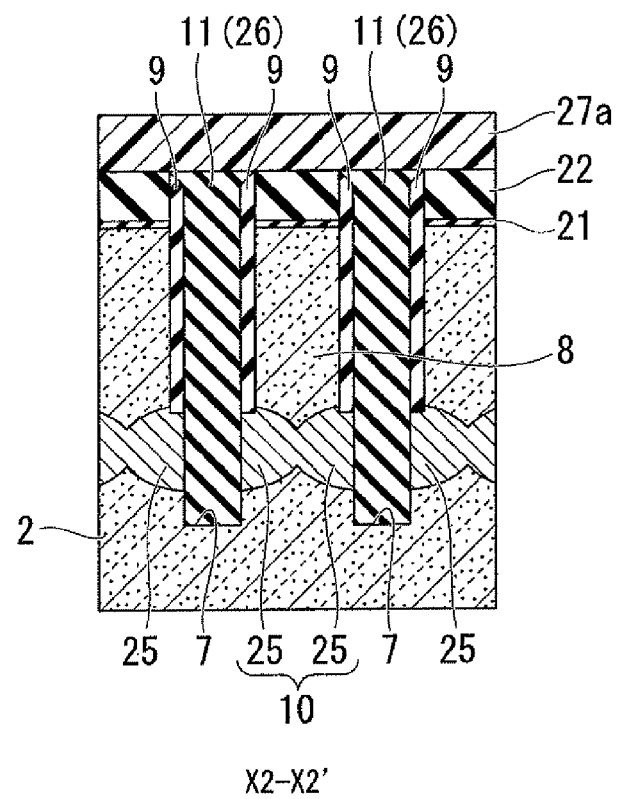
FIG. 10D is a fragmentary cross sectional elevation view, taken along an X2-X2' line of FIG. 9A, illustrating a memory cell in a step, subsequent to the step of FIGS. 9A to 9E, involved in a method of forming the semiconductor device of FIGS. 1A to 1C in accordance with one embodiment of the present invention.

FIG. 10A is a cross-sectional view of the present process taken along line Y1-Y1' of FIG. 9A. FIG. 10B is a cross-sectional view taken along line Y2-Y2' of FIG. 9A. FIG. 10C is a cross-sectional view taken along line X1-X1' of FIG. 9A. FIG. 10D is a cross-sectional view taken along line X2-X2' of FIG. 9A. As shown in FIGS. 10A to 10D, the device formation region 6 and the device isolation region 5 which are shown through the opening 27c are patterned by the anisotropic dry etching process using the first and second resist patterns 27a and 27b as masks. In this case, the device formation region 6 and the device isolation region 5 are partly removed to expose the buried bit line 10 (impurity diffusion layer 25). The device formation region 6 and the device isolation region 5 may be partly removed to form the grooves 12 and 12A with a depth of 220 nm. In this case, an upper part of the buried bit line 10 is removed by 20 nm.

Due to this, the plurality of the stripe-shaped grooves 12 for gate electrode formation extending in the second direction X are arranged side by side in the device formation region 6. The plurality of pillars 8 protrude from a rectangular region partitioned by the grooves 7 and 12. Each of the plurality of pillars 8 has the columnar shape. There are provided grooves 12A which extend in the first direction Y. Each groove 12A is provided inside the device isolation region 5. The groove 12A is provided outside the outermost pillar 8 included in the alignment in the second direction X of the pillars 8. The groove 12A extends in the first direction Y and between the device isolation region 5 and the outermost pillars 8 which are aligned in the first direction Y. The grooves 12A have the same depth as the grooves 12 for gate electrode formation. Bottom surfaces of the grooves 12 and 12A have the same height, and thereby it is possible to prevent a stepped portion from being generated in the gate electrode 14 formed in the later step shown in FIG. 11. Also, it is possible to prevent a short circuit between the gate electrodes 14.

Figure 11A:
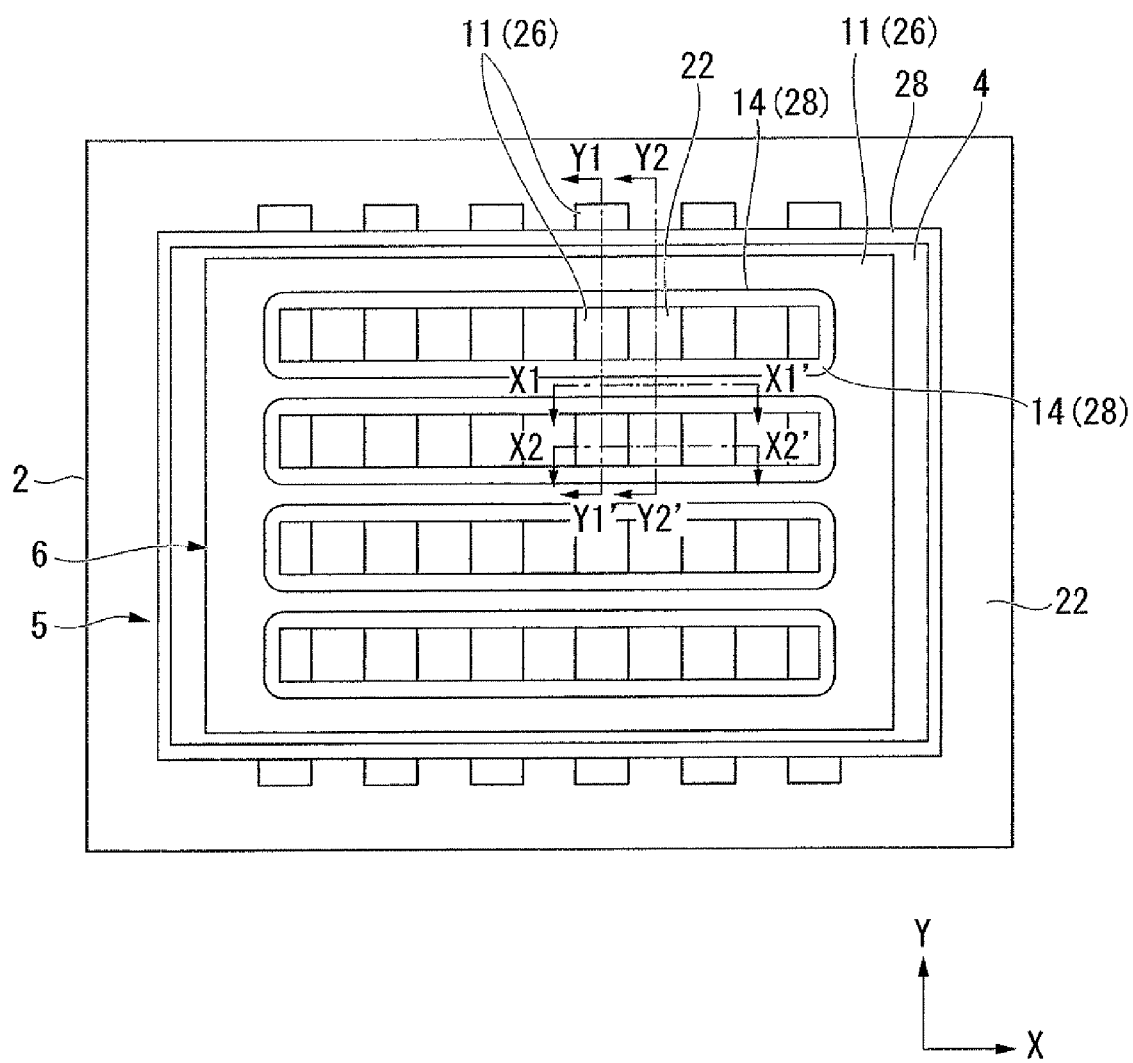
FIG. 11A is a fragmentary plan view illustrating a memory cell in a step, subsequent to the step of FIGS. 10A to 10D, involved in a method of forming the semiconductor device of FIGS. 1A to 1C in accordance with one embodiment of the present invention.
Figure 11B:
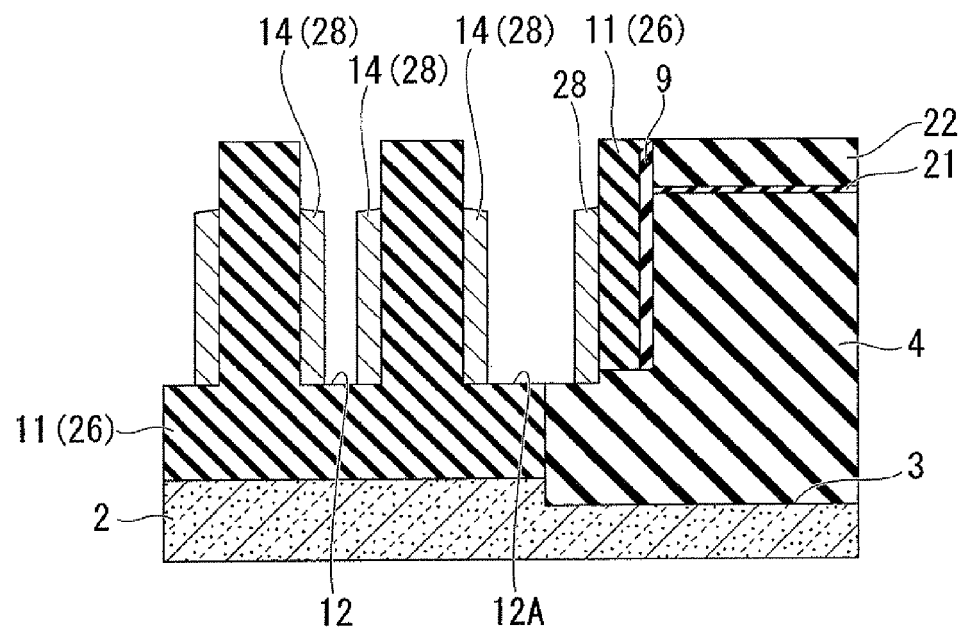
FIG. 11B is a fragmentary cross sectional elevation view, taken along an Y1-Y1' line of FIG. 11A, illustrating a memory cell in a step, subsequent to the step of FIGS. 10A to 10D, involved in a method of forming the semiconductor device of FIGS. 1A to 1C in accordance with one embodiment of the present invention.
Figure 11C:
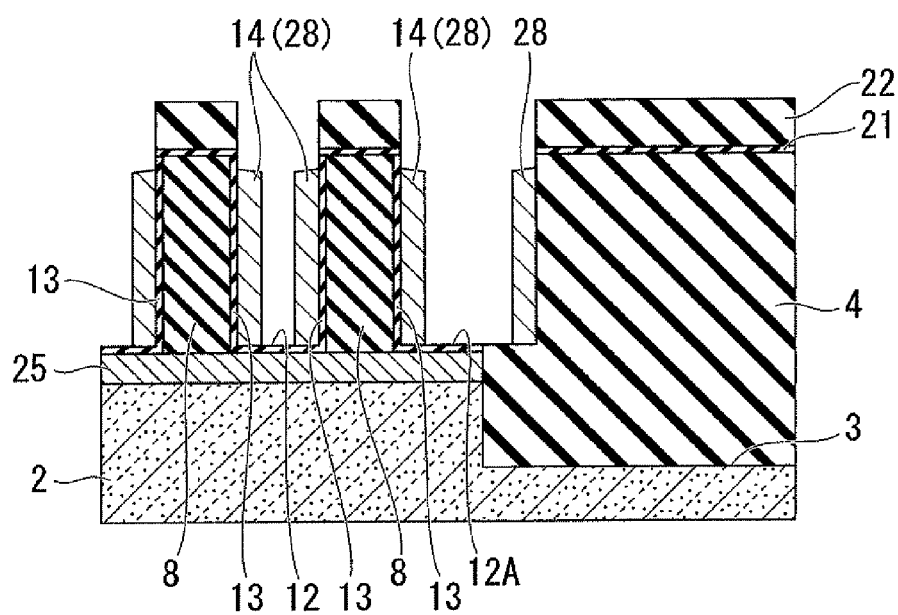
FIG. 11C is a fragmentary cross sectional elevation view, taken along an Y2-Y2' line of FIG. 11A, illustrating a memory cell in a step, subsequent to the step of FIGS. 10A to 10D, involved in a method of forming the semiconductor device of FIGS. 1A to 1C in accordance with one embodiment of the present invention.
Figure 11D:
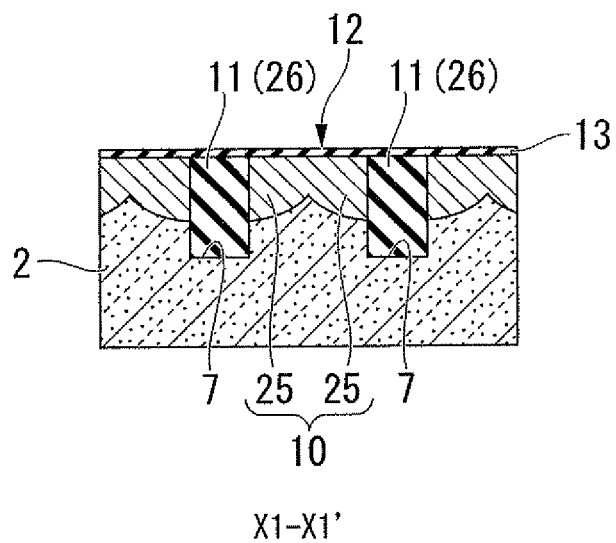
FIG. 11D is a fragmentary cross sectional elevation view, taken along an X1-X1' line of FIG. 11A, illustrating a memory cell in a step, subsequent to the step of FIGS. 10A to 10D, involved in a method of forming the semiconductor device of FIGS. 1A to 1C in accordance with one embodiment of the present invention.
Figure 11E:
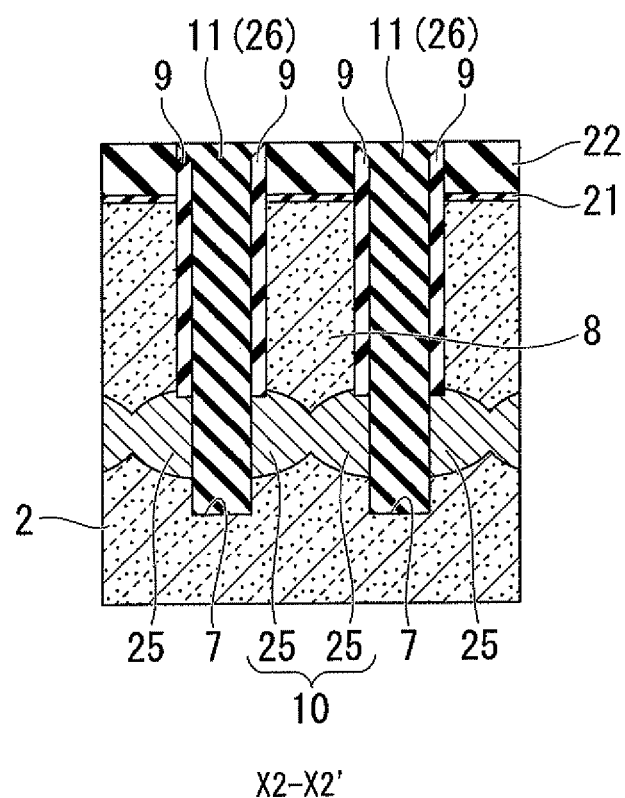
FIG. 11E is a fragmentary cross sectional elevation view, taken along an X2-X2' line of FIG. 11A, illustrating a memory cell in a step, subsequent to the step of FIGS. 10A to 10D, involved in a method of forming the semiconductor device of FIGS. 1A to 1C in accordance with one embodiment of the present invention.

FIG. 11A is a plan view of the present process. FIG. 11B is a cross-sectional view taken along line Y1-Y1' of FIG. 11A. FIG. 11C is a cross-sectional view taken along line Y2-Y2' of FIG. 11A. FIG. 11D is a cross-sectional view taken along line X1-X1' of FIG. 11A. FIG. 11E is a cross-sectional view taken along line X2-X2' of FIG. 11A. As shown in FIGS. 11A to 11E, the first and second resist patterns 27a and 27b are removed. The gate insulating film 13 formed of a silicon oxide film is then formed in the both side surfaces of the pillars 8. The gate insulating film 13 is formed by oxidizing the semiconductor substrate 2 (silicon substrate) appearing on both side surfaces and a bottom surface of each of the grooves 12 and 12A using an in situ steam generation (ISSG) process. A thickness of the silicon oxide film may be 5 nm. The gate insulating film 13 may be formed using the CVD method.

The gate electrode 14 (word line) is formed on the both side surfaces of the groove 12 for gate electrode formation. The gate insulating film 13 is interposed between the gate electrode 14 and the side surface of the groove 12. The gate electrode 14 is formed as follows. A doped silicon film 28 is deposited with a thickness at which it is not completely buried in the grooves 12 and 12A, using the CVD method having good step coverage property. The thickness of the doped silicon film 28 may be 12 nm. The doped silicon film 28 is etched using the anisotropic dry etching process to remain only in the grooves 12 and 12A. Due to this, the word line, parts of which perform as pairs of the gate electrodes 14, extends in loop. The loop of the word line surrounds the alignment of pillars 8. The loop of the word line has a longitudinal direction in the second direction X. The doped silicon film 28 is also formed to surround an outer circumferential surface formed by the grooves 12 and 12A.

Figure 12A:
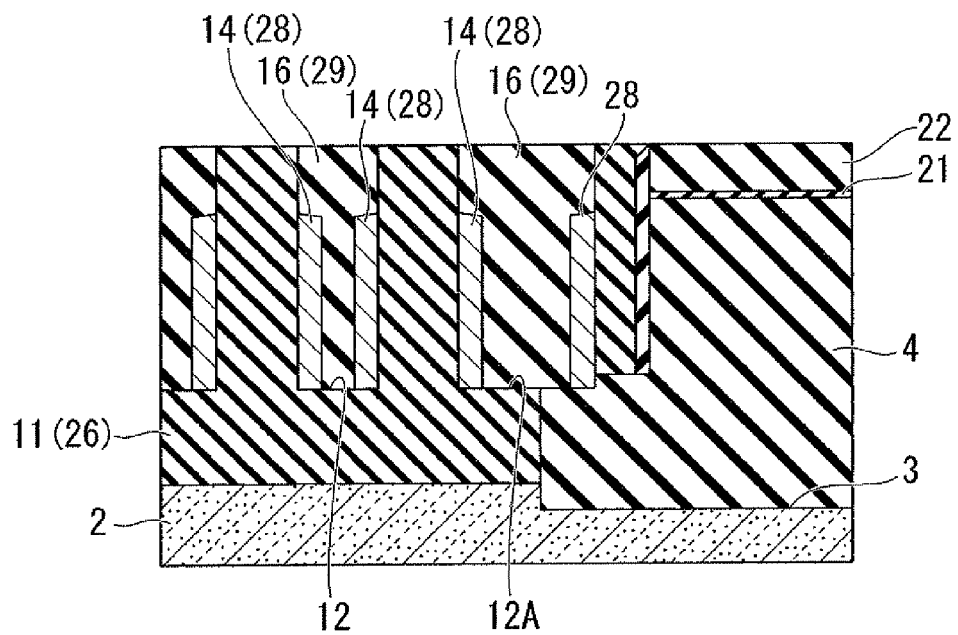
FIG. 12A is a fragmentary cross sectional elevation view, taken along an Y1-Y1' line of FIG. 11A, illustrating a memory cell in a step, subsequent to the step of FIGS. 11A to 11E, involved in a method of forming the semiconductor device of FIGS. 1A to 1C in accordance with one embodiment of the present invention.
Figure 12B:
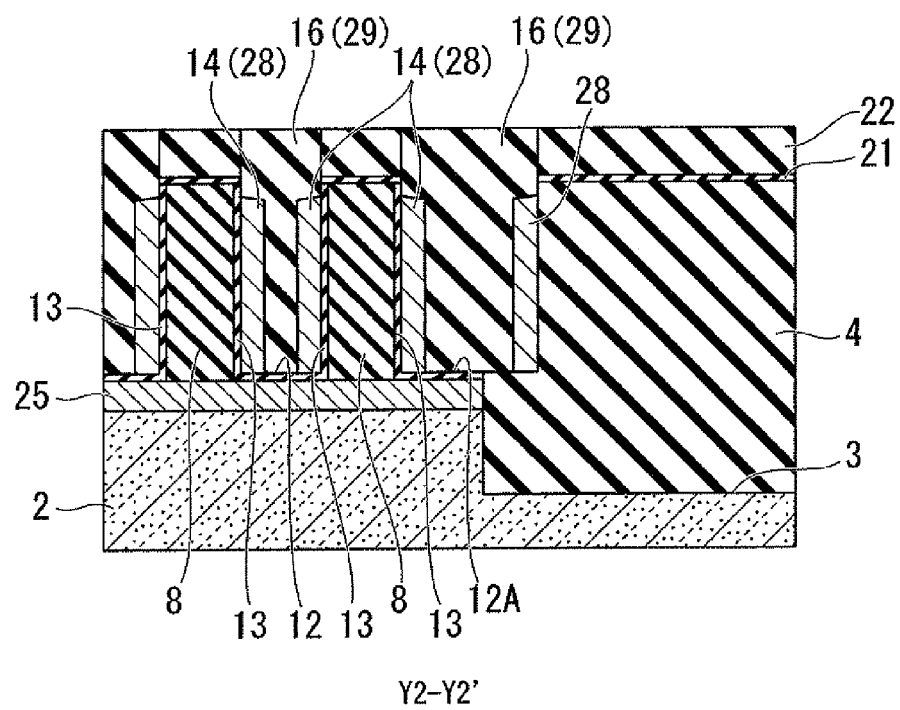
FIG. 12B is a fragmentary cross sectional elevation view, taken along an Y2-Y2' line of FIG. 11A, illustrating a memory cell in a step, subsequent to the step of FIGS. 11A to 11E, involved in a method of forming the semiconductor device of FIGS. 1A to 1C in accordance with one embodiment of the present invention.
Figure 12C:
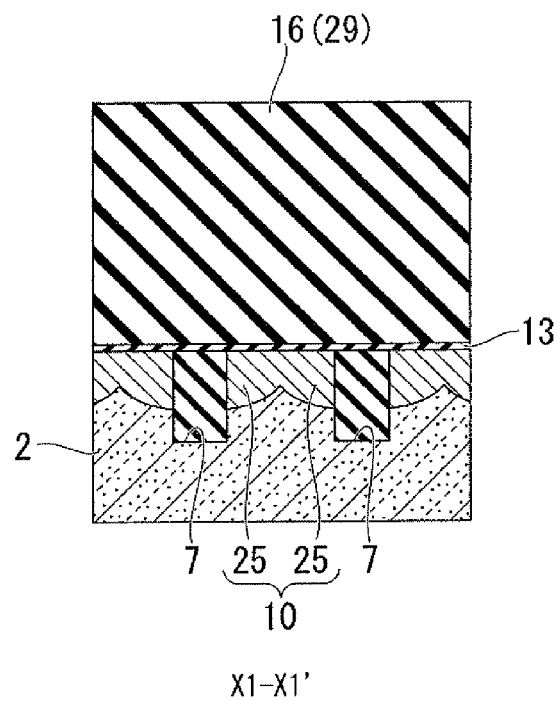
FIG. 12C is a fragmentary cross sectional elevation view, taken along an X1-X1' line of FIG. 11A, illustrating a memory cell in a step, subsequent to the step of FIGS. 11A to 11E, involved in a method of forming the semiconductor device of FIGS. 1A to 1C in accordance with one embodiment of the present invention.
Figure 12D:
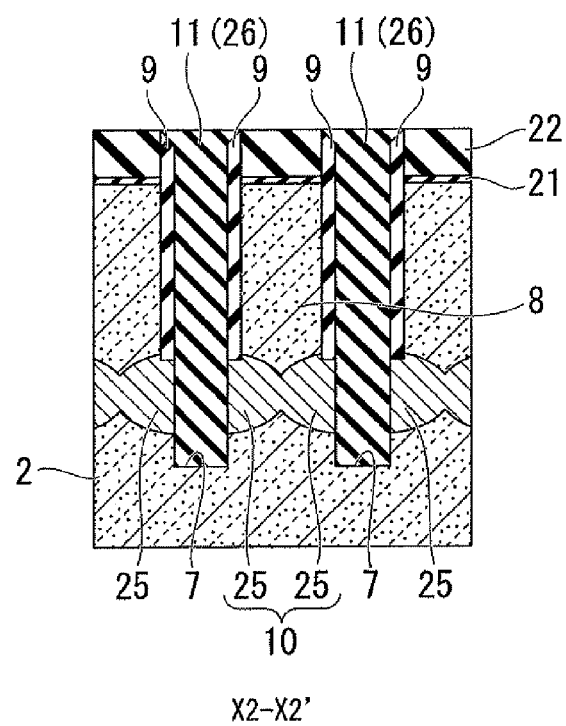
FIG. 12D is a fragmentary cross sectional elevation view, taken along an X2-X2' line of FIG. 11A, illustrating a memory cell in a step, subsequent to the step of FIGS. 11A to 11E, involved in a method of forming the semiconductor device of FIGS. 1A to 1C in accordance with one embodiment of the present invention.

FIG. 12A is a cross-sectional view of the present process taken along line Y1-Y1' of FIG. 11A. FIG. 12B is a cross-sectional view taken along line Y2-Y2' of FIG. 11A. FIG. 12C is a cross-sectional view taken along line X1-X1' of FIG. 11A. FIG. 12D is a cross-sectional view taken along line X2-X2' of FIG. 11A. As shown in FIGS. 12A to 12D, the silicon oxide film 29 is deposited over the entire surface of the semiconductor substrate 2 using an HDP-CVD method with thickness to be buried in the grooves 12 and 12A. A surface of the silicon oxide film 29 is planarized by polishing using a CMP method until a surface of the silicon nitride film 22 acting as a stopper is exposed. Due to this, the second buried insulating films 16 formed of the silicon oxide film 29 are formed in the grooves 12 for gate electrode formation and the groove 12A.

Figure 13:
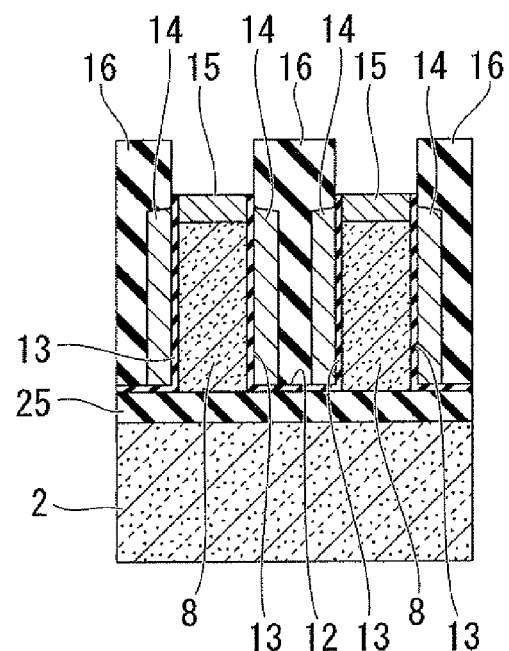
FIG. 13 is a fragmentary cross sectional elevation view, taken along an Y2-Y2' line of FIG. 11A, illustrating a memory cell in a step, subsequent to the step of FIGS. 12A to 12D, involved in a method of forming the semiconductor device of FIGS. 1A to 1C in accordance with one embodiment of the present invention.

FIG. 13 is a cross-sectional view of the present process taken along line Y2-Y2' of FIG. 11a. As shown in FIG. 13, the silicon nitride film 22 and the silicon oxide film 21 on each of the pillars 8 are removed. The impurity diffusion layer 15 is formed by introducing an impurity into an upper surface of the pillars 8 using the ion implantation process. Implantation energy may be 10 KeV, and a dosage may be $1\times10^{15}$ atoms/$cm^2$ using arsenic as the impurity.

Figure 14:
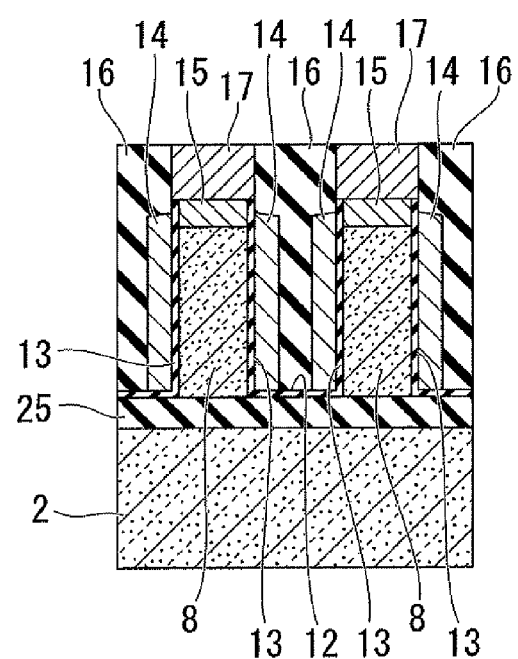
FIG. 14 is a fragmentary cross sectional elevation view, taken along an Y2-Y2' line of FIG. 11A, illustrating a memory cell in a step, subsequent to the step of FIG. 13, involved in a method of forming the semiconductor device of FIGS. 1A to 1C in accordance with one embodiment of the present invention.

FIG. 14 is a cross-sectional view of the present process taken along line Y2-Y2' of FIG. 11A. As shown in FIG. 14, a doped silicon film is formed to have sufficient thickness to be buried between the second buried insulating films 16 using the CVD method. A surface of the doped silicon film is planarized by polishing using the CMP method until a surface of the second buried insulating film 16 is exposed. Due to this, the contact plug 17 is formed to be buried in the groove 8. The contact plug 17 is formed on the impurity diffusion layer 15.

Figure 15A:
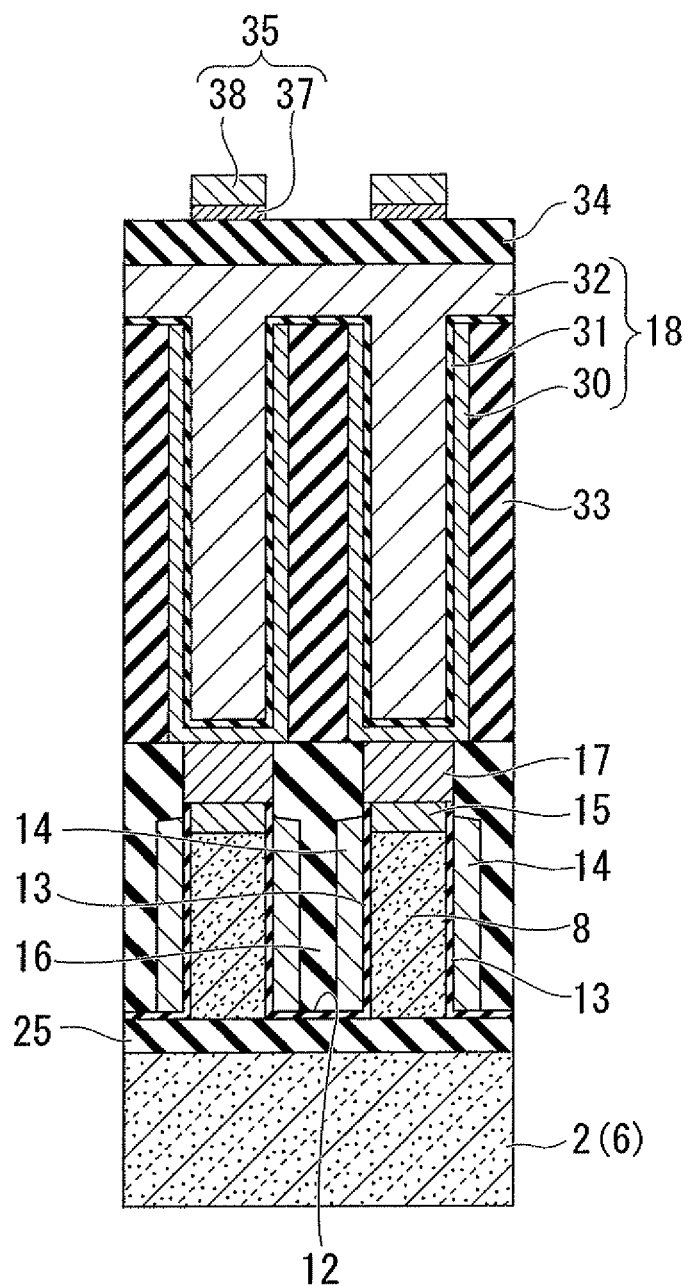
FIG. 15A is a fragmentary cross sectional elevation view, taken along an Y2-Y2' line of FIG. 11A, illustrating a memory cell in a step, subsequent to the step of FIG. 14, involved in a method of forming the semiconductor device of FIGS. 1A to 1C in accordance with one embodiment of the present invention.
Figure 15B:
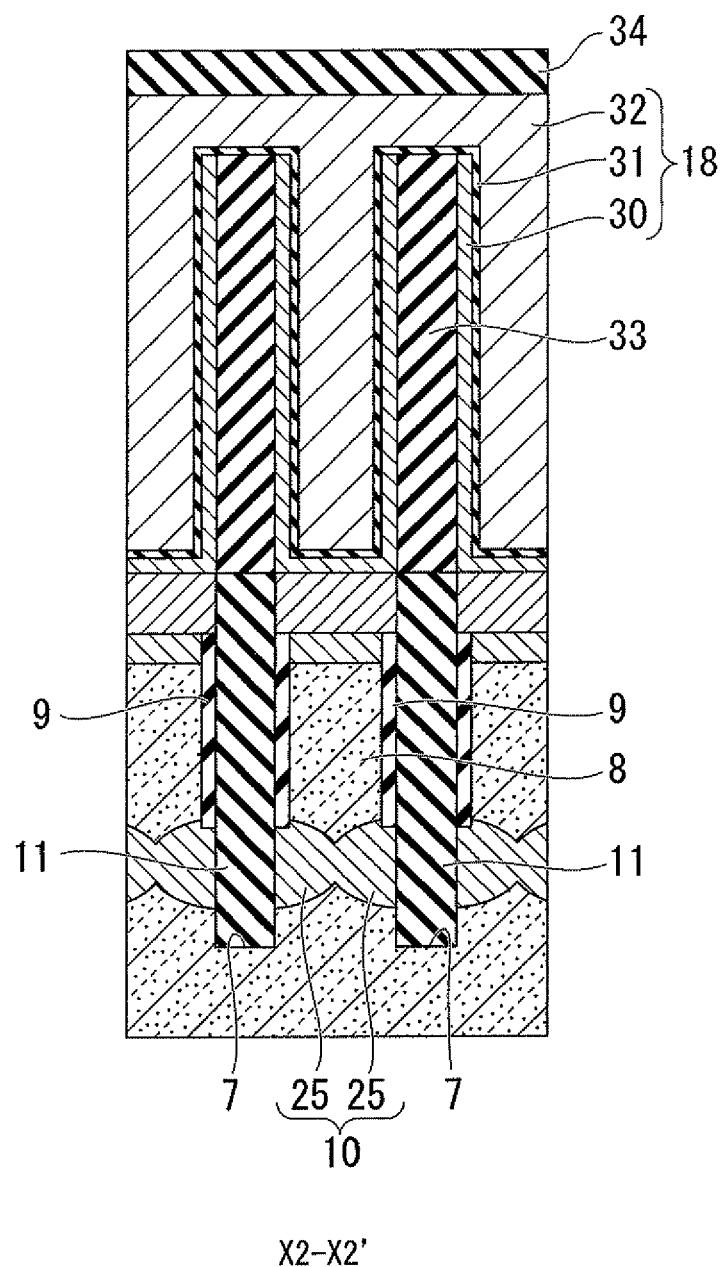
FIG. 15B is a fragmentary cross sectional elevation view, taken along an X2-X2' line of FIG. 11A, illustrating a memory cell in a step, subsequent to the step of FIG. 14, involved in a method of forming the semiconductor device of FIGS. 1A to 1C in accordance with one embodiment of the present invention.

FIG. 15A is a cross-sectional view of the present process taken along line Y2-Y2' of FIG. 11A. FIG. 15B is a cross-sectional view of the present process taken along line X2-X2' of FIG. 11A. As shown in FIGS. 15A and 15B, a first interlayer insulating film 33 is formed over the semiconductor substrate 2. A capacitor hole is formed in a position of the first interlayer insulating film 33, which corresponds to the contact plug 17.

A lower electrode film 30 and a capacitive insulating film 31 are sequentially stacked to have a thickness at which the lower electrode film 30 and the capacitive insulating film 31 are not completely buried in the capacitor hole. An upper electrode film 32 is formed to cover the surface of the semiconductor substrate 2 and to be buried in the capacitor hole, and thereby the capacitor 18 is formed.

A second interlayer insulating film 34 is formed to cover a surface of the upper electrode film 32. A wiring layer 35 is formed on the second interlayer insulating film 34. The wiring layer 35 is a stack of a barrier layer 37 and a main wiring layer 38. The wiring layer 35 is formed by patterning the barrier layer 37 and the main wiring layer 38. A third interlayer insulating film 36 is formed to cover a surface of the second interlayer insulating film 34 in which the wiring layer 35 is formed.

By the above described processes, the semiconductor device 1 shown in FIG. 1 can be manufactured.

As described above, in the method of manufacturing the semiconductor device 1, the groove 7 including the groove portions 7a and 7b is formed. The groove 7 extends in the first direction Y. The both ends of the groove 7 reach the device isolation region 6. The groove portion 7a extending in the first direction Y divides the device formation region 6. The groove portion 7b is in the device isolation region 5.

In this case, for forming the buried bit line 10, the impurity diffusion layer 25 is formed by diffusing the impurity to the both side surfaces of the groove portion 7a in the device formation region 6. The impurity diffusion is self-aligned to the end of the device insulating film 4 because of the presence of the groove portion 7b in the device isolation region 5. Two adjacent ends of the buried bit lines 10 are isolated and separated from each other by the groove portion 7b. It is possible to prevent the adjacent buried bit lines 10 from being shorted.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   an isolation region having a first depth;
   a semiconductor region surrounded by the isolation region;
   a groove in the semiconductor region;
   an insulating film in the groove;
   a buried bit line extending along the groove, the buried bit line being terminated by the isolation region and being an impurity diffusion region of the semiconductor region;
   a plurality of pillars in the semiconductor region, the plurality of pillars being aligned along the groove;
   a gate electrode disposed on a side surface of each of the pillars, and along only a portion of a peripheral edge of each of the pillars in plan view; and
   a gate insulating film provided on a side surface and a bottom surface of the gate electrode,
   wherein the groove extends deeper than the buried bit line, and
   wherein the groove crosses a boundary of the isolation region and the semiconductor region.

2. The semiconductor device according to claim 1, wherein the groove extends in a first direction.

3. The semiconductor device according to claim 2, wherein the gate insulating film is disposed on a side surface and a bottom surface of a trench, and the trench extends in a second direction that is perpendicular to the first direction.

4. The semiconductor device according to claim 1, wherein the buried bit line includes first and second buried bit lines, the groove being disposed between the first and second buried bit lines, the ends of each of the first and second buried bit lines reaching the isolation region.

5. The semiconductor device according to claim 1 further comprising:
   a transistor in each of the plurality of pillars, a part of the buried bit line functioning as one of source and drain of the transistor.

6. The semiconductor device according to claim 2, wherein the buried bit line located in a side surface of the groove.

7. A semiconductor device comprising:
   an isolation region having a first depth;
   a semiconductor region surrounded by the isolation region;
   first and second grooves in the semiconductor region, the first and second grooves extending in parallel to each other;
   insulating films in the first and second grooves;
   a buried bit line extending along the first groove, the buried bit line being terminated by the isolation region and being an impurity diffusion region of the semiconductor region;
   a plurality of pillars in the semiconductor region, the plurality of pillars being aligned along one of the first and second grooves;
   a gate electrode disposed on a side surface of each of the pillars, and along only a portion of a peripheral edge of the each of the pillars in plan view; and
   a gate insulating film provided on a side surface and a bottom surface of the gate electrode, wherein the first groove extends deeper than the buried bit line, and wherein the first and second grooves cross a boundary of the isolation region and the semiconductor region.

8. The semiconductor device according to claim 7, further comprising:

a transistor in each of the plurality of pillars, a part of the buried bit line functioning as one of source and drain of the transistor.

9. The semiconductor device according to claim 7, wherein the gate insulating film is disposed on a side surface and a bottom surface of a trench, and the trench extends in a direction that is perpendicular to the extending direction of the first and second grooves.

10. The semiconductor device according to claim 7, wherein the buried bit line located in a side surface of at least one of the first and second grooves.

11. A semiconductor device comprising:

a semiconductor substrate including an isolation region, the isolation region having a first depth;

an insulating film on a surface region of the semiconductor substrate, the insulating film surrounding a semiconductor region of the semiconductor substrate;

first and second grooves in the semiconductor region, the first and second grooves extending in a first direction, the first and second grooves being disposed adjacent to each other;

insulators in the first and second grooves;

a buried bit line in the semiconductor region, the buried bit line extending in the first direction, the buried bit line being an impurity diffusion region of the semiconductor region, in contact with the insulators, and terminated by the insulating film;

a plurality of pillars in the semiconductor region, the plurality of pillars being aligned along one of the first and second grooves;

a gate electrode disposed on a side surface of each of the pillars, and along only a portion of a peripheral edge of the each of the pillars in plan view; and a gate insulating film provided on a side surface and a bottom surface of the gate electrode, wherein the first groove extends deeper than the buried bit line, and wherein the first and second grooves cross a boundary of the insulating film and the semiconductor region.

12. The semiconductor device according to claim 11, wherein bottom surfaces of the first and second of grooves are higher in level than a bottom surface of the isolation region.

13. The semiconductor device according to claim 11, further comprising:

a transistor in each of the plurality of pillars, a part of the buried bit line functioning as one of source and drain of the transistor.

14. The semiconductor device according to claim 13, further comprising:

a capacitor electrically coupled to the transistor, the capacitor being disposed over the transistor.

15. The semiconductor device according to claim 11, wherein the gate insulating film is disposed on a side surface and a bottom surface of a trench, and the trench extends in a second direction that is perpendicular to the first direction.

16. The semiconductor device according to claim 11, wherein the buried bit line located in a side surface of at least one of the first and second grooves.

* * * * *